US008050432B2

(12) United States Patent
De Klerk

(10) Patent No.: US 8,050,432 B2
(45) Date of Patent: Nov. 1, 2011

(54) SOUND SYSTEM

(75) Inventor: Leendert De Klerk, 's-Gravendeel (NL)

(73) Assignee: Bloomline Acoustics B.V., 's-Gravendeel (NL)

( * ) Notice: Subject to any disclaimer, the term of this patent is extended or adjusted under 35 U.S.C. 154(b) by 1075 days.

(21) Appl. No.: 11/909,459

(22) PCT Filed: Mar. 21, 2006

(86) PCT No.: PCT/EP2006/060925
§ 371 (c)(1), (2), (4) Date: Sep. 21, 2007

(87) PCT Pub. No.: WO2006/100250
PCT Pub. Date: Sep. 28, 2006

(65) Prior Publication Data

US 2008/0063224 A1 Mar. 13, 2008

(30) Foreign Application Priority Data

Mar. 22, 2005 (EP) .................................... 05102304

(51) Int. Cl.
*H04R 3/00* (2006.01)
*H04R 5/02* (2006.01)
*H04R 9/06* (2006.01)
*H04R 9/08* (2006.01)
*H04R 25/00* (2006.01)
*H05K 5/00* (2006.01)

(52) U.S. Cl. .......... 381/304; 381/92; 381/182; 381/335; 381/336; 381/356; 181/144; 181/145; 181/147

(58) Field of Classification Search .................. 381/304, 381/92, 182, 335, 336, 356; 181/144, 145, 181/147
See application file for complete search history.

(56) References Cited

U.S. PATENT DOCUMENTS 3,054,856 A * 9/1962 Arany ............................ 381/89
3,649,776 A * 3/1972 Burton .......................... 381/342
3,759,345 A * 9/1973 Borisenko ..................... 181/145
4,179,008 A * 12/1979 LeTourneau .................. 181/147
4,237,339 A * 12/1980 Bunting et al. .......... 379/420.03
4,503,553 A * 3/1985 Davis ............................ 381/303
4,596,034 A * 6/1986 Moncrieff ....................... 381/89
5,309,518 A * 5/1994 Ickler et al. .................. 381/336

(Continued)

FOREIGN PATENT DOCUMENTS

DE 19605130 A1 8/1997

(Continued)

*Primary Examiner* — Elvin G Enad
*Assistant Examiner* — Christina Russell
(74) *Attorney, Agent, or Firm* — Thorne & Halajian, LLP; Gregory L. Thorne

(57) ABSTRACT

To conclude, in a preferred embodiment in accordance with the invention, the sound system comprises two loudspeakers (LA, LB) which mask their spectral signatures at the ear (C1) of the listener by positioning the two loudspeakers (LA, LB) such that their maxima of the polar radiation patterns have directions which at least differ 30 degrees, and which generate coherent sound in the direction of the listener. These two aspects together cause different gradients of the sound of the two loudspeakers (LA, LB) at the same ear (C1) of the listener, while the information which reaches the ear (C1) from the spatially shifted different loudspeakers (LA, LB) is still coherent and not blurred by diffusion. The loudspeakers LA, LB should be spaced apart to obtain sufficient different gradients of their sound at the same ear.

25 Claims, 8 Drawing Sheets

U.S. PATENT DOCUMENTS 5,524,059 A * 6/1996 Zurcher .......................... 381/92
5,526,411 A * 6/1996 Krieter ..................... 379/110.01
5,781,645 A * 7/1998 Beale ............................ 381/370
5,784,474 A * 7/1998 Kohut et al. .................... 381/97
5,809,150 A * 9/1998 Eberbach ...................... 381/300
5,857,027 A * 1/1999 Gaidarov et al. ............. 381/182
5,949,893 A * 9/1999 Augustin ...................... 381/182
6,023,490 A * 2/2000 Ten Kate ....................... 375/240
6,068,080 A * 5/2000 LaCarrubba .................. 181/155
6,118,883 A * 9/2000 Rocha ........................... 381/387
6,343,133 B1 * 1/2002 Adamson ...................... 381/340
6,603,862 B1 * 8/2003 Betts ............................ 381/336
6,621,909 B1 * 9/2003 Webb et al. ................... 381/342
7,577,265 B2 * 8/2009 Pazandeh ...................... 381/160
2004/0131217 A1 * 7/2004 Opie et al. .................... 381/336
2004/0240697 A1 * 12/2004 Keele, Jr. ...................... 381/336
2006/0050907 A1 * 3/2006 Levitsky ....................... 381/304

FOREIGN PATENT DOCUMENTS

EP 1475992 A2 10/2004
GB 394325 A1 6/1933

* cited by examiner

SOUND SYSTEM

FIELD OF THE INVENTION

The invention relates to a sound system for improved electro-acoustical transmission of auditory sound information, to a multi-channel sound system comprising for at least two channels such a sound system for improved electro-acoustical transmission, a stand for use in the sound system, a single encasing comprising the sound system, and a storage medium or transmission signal comprising a first signal and a second signal obtained from the electro-acoustical transducer structures of the sound system.

BACKGROUND OF THE INVENTION

Prior art sound systems comprise one—or multi—channel transducer arrays to improve the quality of the transmission of target sound information. For example, transducer arrays such as the two loudspeaker boxes in a stereo set-up, may provide a listener with two similar sound signals. A binaural listener is able to localize a stereophonic sound source in-between the two loudspeakers if the ears receive the two signals more or less concurrently and with equal intensity as is disclosed in GB 394,325. The summing localization mechanism of the binaural ear-brain system then provides the listener with the impression that one or more virtual sources are present in-between the two adjacent physical speakers. This is disclosed in B. C. J. Moore, An Introduction to the Psychology of Hearing, 4th Ed., Academic, San Diego (1997) p. 232, 234. However, although especially with multi channel arrays, the transmitted sound is now perceived to have a better integrity of the target sound information than the sound of one speaker alone, such sound systems have the problem that the respective transducers of the array are localizable because the spatial-spectral character of the loudspeakers remains detectable, which affects the advantages of this technique negatively, as is disclosed in G. Theile, “Über die Lokalisation im Überlagerten Schallfeld”. Dissertation, Techn. Universität Berlin (1980)

All sound transducers which are impedance matched to the air, most efficiently interact with those sound waves that have wavelengths corresponding to the physical dimensions of the transducer structure. This effect influences the frequency response to vary with direction and causes resonant characteristics. The resulting sound wave fronts are modified by the so called baffle step. More information on the baffle step is found in the article of Andy Unruh, “Understanding Cabinet Edge Diffraction”, Unruh Acoustics, http://www.speaker-design.net/understand.html. Reflection and diffraction of the waves according to the shape of the enclosure of the transducer element and by the shape of the transducer element itself, cause frequency dependent particle velocity gradients of the pressure differences which model the polar response pattern of the transducer structure. Relevant publications are Olson, H. F., “Direct Radiator Loudspeaker Enclosures”, JAES Vol. 17, No. 1, 1969 October, pp. 22-29; Joerg Panzer, “Far-field radiation from a source in a flat rigid baffle of finite size”, New Transducers Ltd, Huntingdon, U.K; and W. R. Woszcsyk, “The Increase of Transducer Directivity Using Diffractive Attachments”, J. Acoust. Soc. Am., Supplement 1, Vol. 84, 1988.

This shape related transfer function, further referred to here as the spatial-spectral contour of the transducer, is apparent in the sound waveforms reaching the ear-drum of the before mentioned listener from the speaker array. This spatial-spectral contour, which is also referred to as the spectral signature when an observer is involved, causes the localizability and affects the perceptual qualities of any resulting virtual sources embedded in the input signal, as disclosed in the publication: G. von Bekesy (1960), E. G. Wever (Editor), “Experiments in Hearing”, New York, N.Y., McGraw Hill. In the now following the spectral signature is used for both situations, it will be clear from the context what is actually meant.

SUMMARY OF THE INVENTION

It is an object of the invention to provide a sound system which decreases the masking of the waveform shape of the target sound due the spatial-spectral contours of sound transducer structures.

A first aspect of the invention provides a sound system as claimed in claim 1. A second aspect of the invention provides a multi-channel sound recording system as claimed in claim 28. A third aspect of the invention provides a stand for use in the sound system as claimed in claim 33. A fourth aspect of the invention provides a single encasing as defined in claim 34. A fifth aspect of the invention provides a storage medium as defined in claim 35. A sixth aspect of the invention provides a transmission signal as defined in claim 36. A seventh aspect of the invention provides a sound system as defined in claim 37. Advantageous embodiments are defined in the dependent claims.

The human hearing system is very sensitive to the transient shape patterns of the amplitude fluctuations of the waveform of the sound that reaches the pressure-only-sensitive ear drums, see B. C. J. Moore, Interference effects and phase sensitivity in hearing, *Phil. Trans. R. Soc. Lond. A* 360: 833-858 (2002). The invention is based on the insight that the monaural spectral coding resolution of this sensitivity of the hearing system appears to be lower than the binaural cross correlation resolution. Monaural spectral coding is defined by Blauert, J., (1983), Spatial hearing—the psychoacoustics of human sound localization, The MIT Press, Cambridge, Mass. This offers the opportunity to re-shape the waveform to be less deteriorated by the spectral signature of the transducers in order to improve the overall system transparency and stability. The ear may now be exposed to two different air particle velocity gradients which relate to the spectral signature of the two transducer structures, respectively. These different air particle velocity gradients interfere with each other and therefore make the particular spectral signatures less detectable by the ear. On the other hand, the coherency of the pressure waves that excite the ear drum is preserved. This decrease of the influence of the spectral signatures of the transducer structure on the resulting waveform envelope causes the transducers to become less pronounced, thus less localizable, effectuating the advantages of the arraying technique. It appeared that if the localizability of the physical sources of the sound is suppressed by diffusing their spatially shifted spectral signatures, other engineering criteria such as concerning linearity are far less decisive. The effect relies on the deduction that the hearing system is a navigation system that primarily senses its physical environment and is, by nature, not developed to deal with virtual sources to be derived from the physical present transducers.

The sound system in accordance with the first aspect of the invention comprises a first and a second transducer structure. A transducer structure usually comprises at least one electro-acoustic transducer and its encapsulation or encasing and optional wave guides. Each transducer structure may comprise a single loudspeaker or may comprise a plurality of loudspeakers. Alternatively, each transducer may be a single microphone or a plurality of microphones, or a single loudspeaker or a plurality of loudspeakers and the other one of the transducers comprises one or more microphones. The plurality of loudspeakers or microphones may be implemented to obtain a desired directivity. These loudspeakers or microphones may cover the complete frequency band. Alternatively, the plurality of loudspeakers or microphones may be implemented to cover together the complete frequency band.

The first transducer structure has a first axis which extends in a maximum directional sensitivity of a uni-axial polar response pattern or which is a rotational symmetry axis of its toroidal polar response pattern. The second transducer structure has a second axis which extends in a maximum directional sensitivity of a uni-axial polar response pattern or which is a rotational symmetry axis of a toroidal polar response pattern. The transducers may have different polar response patterns. If the polar response pattern is uni-axial, the defined axis is the axis extending in the direction of the maximum in the response pattern. If the polar response is toroidal, the defined axis is the rotational symmetry axis of the polar response pattern. The definition of these axes is required to make clear in the now following how the transducer structures have to be arranged to decrease the effect of the spectral signature of the transducer structures. The toroidal and the uni-axial polar response patterns need not be present in a complete circle or over the full audio frequency range. Preferably, their directivity spectra are related to a baffle step of the same order of magnitude. Preferably, the baffle step is related to a radiation surface not exceeding the dimensions of about a human head: about 14-23 cm. It has to be noted that the transducer structures may have different maximum directional sensitivities for different frequencies, and that for low frequency the transducer structures may have an omni-directional polar response pattern.

The transducer structures are positioned to obtain: an angle in a range of substantially −30 to 30 degrees between a median plane of a human reference listener and a line connecting acoustic centers of the first acoustic transducer and the second transducer. The median plane is disclosed in the publication B. C. J. Moore, An Introduction to the Psychology of Hearing, 4th Ed., Academic, San Diego (1997), P. 214. This line is further referred to as the interconnect line. This means that both the first and the second transducer are present at a same side of the median plane or in the median plane, and that the difference in distance between both transducers and the median plane is within limits defined by the angles. Preferably, the interconnect line extends substantially parallel to the median plane such that the transducers have substantially equal distances to the median plane.

The human reference listener is an imaginary person. In the embodiments wherein the transducers all are loudspeaker, actually a listener may be present at this imaginary position. In the embodiments wherein the transducers all are microphones, actually the head of the listener may be thought to be present at this position. The sound recorded by the microphones reflects what a person would hear if he were at this position.

If both the first and the second transducer have either a uni-axial or toroidal polar response pattern, the transducers should further be positioned to obtain an angle of substantially 70 to 110 degrees between the first axis and the second axis. It has to be noted that the sound propagates in directions substantially along the first or second axis if the transducer has a uni-axial polar response pattern, and that the sound propagates substantially in a plane perpendicular to the first or second axis if the transducer has the toroidal polar response. The main propagation direction of the sound waves is also referred to as their main particle velocity. The different angles of the axes cause main particle velocities which for the first and second transducers are directed in different directions. Preferably the different directions of the main particle velocities have an angle of substantially 90 degrees.

Thus, if two transducers are used which both have a uni-axial polar response pattern; the two axes which indicate the two main particle velocities make an angle between 70 to 110 degrees. If a real listener is present at the location of the reference listener, the sound fronts of both transducers reach the listener with particle velocity gradients which have different directions on the surface of the ear of the listener. As will be elucidated later, this causes the ear to become unable to detect the spectral signatures in the respective waveforms with the positive effect that the colorization of the sound due the spectral signatures is decreased. The same holds for microphones which have their maximum directivity for particle velocities components in different directions that are defined by a baffle step. Now, the colorization of the recorded sound due to spectral signatures of the microphones is decreased.

To conclude, the differently directed gradients of the particle velocities prevent the ear to segregate the spectral signatures of the sound sources by means of monaural spectral coding. Or said differently, the spectral signatures of the two acoustic transducer structures mask each other, because also binaural cross correlation is prevented, thus the interacting transducer structures now can not be localized. The sound is more natural and the dimensions of the sound generating items of the original sound stage are reproduced more precisely without being limited in their auditory dimensions by the dimensions of the drivers as reflected in their spectral signatures.

Alternatively, if two transducers are used which both have a toroidal polar response pattern, the planes of maximum directivity which extend substantially perpendicular to the rotational symmetry axes, make an angle in the defined range. Again, although in each plane maximum directivities exist which have the specified angles, the angle between the planes takes care that the directivities for the toroidal polar response pattern do not occur in the same plane.

Still for the same configuration of polar response patterns, the transducers should be further positioned to obtain an angle of substantially 70 to 110 degrees between said median plane and either the first or the second axis. Thus, at least one of the main particle velocities should be directed to the median plane, within the defined range. Preferably, this angle is 90 degrees. It has to be noted that seen from the position of the human reference listener both transducers are directed off-axis.

If the first acoustical transducer has a uni-axial polar response pattern and the second transducer has a toroidal polar response pattern, the transducers have to be positioned to obtain an angle of 70 to 110 degrees between the first axis and a plane perpendicular to the second axis. Again, the main particle velocity of the uni-axial transducer has the defined angle with the plane such that this main particle velocity has a non-zero angle with respect to all particle velocities of the toroidal transducer. Further, the transducers of this configuration are positioned to obtain an angle between 70 to 110 degrees between the median plane and either the first axis or the plane perpendicular to the second axis.

It suffices that the first and second transducers expose increasing directivity with increasing frequency, provided that their polar response patterns are both monotonous diffuse field frequency responses and linear free field frequency responses on the off-axes that are directed to the reference listener. The first and second transducer structures comprise transducers with a flat or convex membrane with respect to the wavelengths of the frequencies to be transferred. This type of transducer structures has several advantages over transducer structures with a concave membrane. Due to fewer converging reflections of the sound waves against the transducer structure, less profiled destructive interference occurs and thus the spectral signature comprises less pronounced fluctuations. Consequently, the polar response pattern shows less directivity at higher frequencies and the polar response pattern has a more regular shape. This allows having an off-axis free field response which is more flat for the relevant frequency range. It has to be noted that it is also important that the off-axis response is optimal because the reference listener is at a position off-axis. It has been experimentally found that the desired effect is not obtained with transducers which have, relative to the wavelengths of their pass band, a concave shaped membrane. Convex shaped membranes which protrude out of the encasing provide the best condition for mutual interference of their off-axis wave fronts.

In a loudspeaker system, the sounds originating from the first and the second transducer structure should be substantially time aligned at the position of the reference listener. If the sound waves originating from the different loudspeakers do not have substantial equal arrival instants for corresponding frequency components, the improvement reached by masking the spectral signature of the loudspeaker boxes may be destroyed. Both sound waves should present substantially the same phase information to the listener for a t least said information which is common for the loudspeakers. Thus the signals supplied to the loudspeakers may have a common part (often referred to as the sum-part) and a difference part. The sum-part should have substantially the same phase difference over the relevant frequency range at the position of the listener.

By way of example only, in an embodiment wherein the first and the second transducer structures contain identical pistonic transducers with convex, thus protruding, cones. It is also possible to use flat membranes or bending wave loudspeakers with a flat or convex membrane, or a hybrid combination of pistonic and bending wave loudspeaker membranes. The effect is best obtained if the angle of lines connecting the acoustical centre of the transducers with the position of the reference listener with respect to the first or second axis are identical. Preferably, the distance between the acoustic centers of the two transducers to the reference listener is identical. Of course, deviations are allowed if a somewhat less optimal behavior is accepted.

If the first and second transducers are microphones, the same holds because the microphones operate reciprocally to loudspeakers.

If, for example, the first transducer structure is a loudspeaker box and the second transducer comprises microphones, the loudspeaker is used to supply an amplified signal recorded by the microphones. The defined positioning of the transducers minimizes the crosstalk between the loudspeaker and the microphones. This allows a higher amplification of the microphone signal. In a preferred embodiment, the defined positioning and the matching baffle steps as well as the coherent off-axis responses of the transducers maximize the spatial spectral interference and minimize the frequency dependent crosstalk between the loudspeaker and the microphones. This stabilizes the feed back loop, which allows a higher amplification of the microphone signal without increase of colorization that masks the target sound information.

It has to be noted that several attempts have been made in the prior art to improve the sound quality of sound reproduced in stereo or multi-channel loudspeaker systems. For example, many systems use differently directed loudspeakers to generate a uniform distribution of sound through a room. But none of these systems achieved that the sounds of the different loudspeakers reach the ears with main particle velocities having sufficiently interfering directions, while at the same time being sufficiently phase coherent with respect to each other over the relevant audible frequency range. The relevant frequency range at least covers two octaves. In fact the best effect is reached if the frequency range is covered which is relevant to detect directionality of the sound source monaurally, that is from about 0.5 to 16 kHz.

The polar radiation pattern may be obtained with one or more pressure gradient transducer elements and/or with a transducer and a waveguide, as long as the combination provides the defined directional frequency response and the phase coherence is sufficiently retained within the relevant frequency range over an off-axis of the polar diagram. For example, an elliptical reflector may be used as the waveguide or both transducers may share one enclosure providing a common baffle step. Although the polar radiation patterns are defined as uni-axial patterns and toroidal patterns, the actual patterns with respect to frequency may have other forms, such as for example cardioid, or hemisphere, provided the frequency dependent directionality of the transducer is smoothly sloping. All these patterns have either a well defined maximum along an axis (the uni-axial patterns), or a multitude of maxima arranged around a central rotational symmetry axis in a plane (the toroidal patterns).

U.S. Pat. No. 5,309,518 discloses a loudspeaker box which comprises at least three loudspeakers which are arranged in vertical direction and which have different angles with respect to each other. The loudspeakers are operative over a number of octaves in the audio frequency range and co-act to illuminate with sound a predetermined solid angle centered at the loudspeaker system substantially uniformly over said number of octaves. Such a construction is used to control the directionality characteristics to b e substantially the same across the entire frequency region. Although this prior art discloses to direct the loudspeakers in different directions, this prior art does not disclose that the sound fronts of the different speakers reach the listener phase coherently and with substantially a same frequency response. This is a solution to obtain a more uniform distribution of sound through a room, but not to decrease the signal distortion produced by the spectral signature of the loudspeakers in their box.

U.S. Pat. No. 5,949,893 discloses a loudspeaker box for faithfully reproducing stereophonic sound. The box is divided into at least two chambers hermetically sealed form each other. The speaker at the front of the box is propagating sound in the direction perpendicular to the front. The speaker at the top of the box propagates sound in the vertical direction but this sound is reflected against a diffuser such that an omni-directional polar radiation pattern is obtained of which the rotational symmetry axis is directed vertically. This speaker/diffuser combination propagates the sound horizontally. The front speaker has been added to change the relatively uniform sound distribution generated by the speaker/diffuser combination to improve the stereophonic effect.

Although this loudspeaker box has two acoustic transducers which are arranged under 90 degrees, the axis directed in the maximum of the uni-axial polar radiation pattern of the front speaker lies in the plane perpendicular to rotational symmetry axis of the polar radiation pattern of the speaker/diffuser combination. No care is taken to obtain sound wave fronts of the different speakers which reach the listener phase coherently and with substantially a same frequency response.

Again, this is a solution to obtain a more uniform distribution of sound through a room, but not to decrease the signal distortion produced by the spectral signature of the loudspeakers in their box.

DE-A-19605130 discloses that two loudspeakers should be directed to point towards each other. These two loudspeakers may be positioned under an angle to obtain a directionality of the radiation pattern. If more than two loudspeakers are used, these loudspeakers are directed such that their rotational symmetry axes intersect in a common point. The loudspeakers may have a convex cone. This prior art is directed to make a phantom or virtual source at the intersection point. It does not disclose the two loudspeakers which are positioned as claimed in the present invention. Such a phantom source is only observed by a listener if the real sources produce a dual mono or a stereo sound, thus when the real sources are present at opposite sides of the median plane of the listener. This is in contrast to the present invention where the transducers are positioned at the same side of the median plane. Further, as shown in the Figures of this prior art, the loudspeakers are positioned near to each other, this generates a lot of uncontrolled reflections of the sound waves of one of the loudspeakers at the cone of t he other loudspeaker which completely destroys the coherent behavior and reveals a more pronounced spectral signature.

In an embodiment in accordance with the invention defined in claim 2, the first and the second acoustic transducer structures have, with respect to the relevant frequency range, off axis flat free field responses along a line of latitude with respect to the main axis or the main plane, and monotonous diffuse field responses. In contrast to concave membranes, the flat or convex membranes are able to provide such a field relatively easy.

In an embodiment in accordance with the invention defined in claim 3, the response patterns are rotational symmetrical to obtain a same behavior in all directions. This is advantageous because the homogeneity of the sound in the listening area improves and the listener is not confronted with large variations in sound quality when moving his head or even when walking through the room.

In an embodiment in accordance with the invention defined in claim 4, the first and second acoustic transducer structures generate respective polar response patterns relating to a baffle step of the same order of magnitude. This causes the transducers to have a same behavior which improves their mutual masking effect.

In an embodiment in accordance with the invention defined in claim 5, the baffle step is related to a radiation surface area having the dimensions of about a human head. This appeared to further improve the mutual masking effect. Most probably because the thus increased mutual similarity of the respective spectral signatures of both the transducers and the human head establishes an even more complex interference pattern which density exceeds the resolution of the monaural spectral coding ability.

In an embodiment in accordance with the invention defined in claim 6, the main axis or plane of the first transducer structure points substantially to an acoustical centre of the second transducer structure. This has the advantage that the angle between the directions of main axes of the first and second transducer structure and the reference listening position are identical for the two sound transducer structures.

In an embodiment in accordance with the invention defined in claim 7, the line connecting the acoustic centers of the first transducer structure and the second transducer structure extends substantially vertical. This allows using a vertical stand to mount the two transducer structures. Instead of a stand, also rod or wires may be used which extend from a ceiling. Further, in this position, the two transducer structures create a minimal difference sound component and thus do not interfere with the sum-localization effect of the two ears and the brain.

In an embodiment in accordance with the invention defined in claim 8, the acoustic centers of the two transducer structures have a same distance to the position of the listener. This usually takes care that the two sound waves are time aligned because they have to travel over a same distance. If the acoustic centers of the transducer structures are now also offset in vertical direction, the distance of each one of the transducer structures to a same ear is equal for both ears.

In an embodiment in accordance with the invention defined in claim 9, the first transducer structure comprises a plurality of transducer elements being concentrically arranged for covering together the relevant frequency range. If several transducer elements are used to cover the complete audible frequency range, the concentric arrangement provides the required phase coherent wave fronts. It is still possible to add a sub-woofer or a super tweeter to the system provided their working range is far below their baffle step in order to prevent a spectral signature contour in the cross over area.

In an embodiment in accordance with the invention defined in claim 10, the sound system comprises, for a monophonic channel only, the first and the second transducer structures at the position defined. No further transducer structures are required then the two defined. Of course, each one of the first and second transducer structures may comprise concentric arranged transducers. Also, a sub-woofer and or a super tweeter may be present besides this arrangement of the two transducer structures.

In an embodiment in accordance with the invention defined in claim 11, the means for positioning is adapted to position the transducer structures at a distance with respect to each other to obtain an angle in a range from 10 to 170 degrees between on the one hand a first imaginary line connecting an acoustical centre of the first transducer structure with the position of the human reference listener and on the other hand a second imaginary line connecting an acoustical centre off the second transducer structure with said same position. Now, the transducer structures are positioned at a predetermined distance from each other such that the defined angle is obtained. This further improves the masking of the spectral signature of the transducer structures because the main particle velocity vectors have now different gradients over the ear in two dimensions. Preferably this angle is in the range from 30 to 120 degrees.

In an embodiment in accordance with the invention defined in claim 12, the first and the second transducer structures are positioned at substantial identical distances with respect to the median plane. This has the advantage that maximally different particle velocity gradients are obtained at the listening position which creates a maximal masking effect.

In an embodiment in accordance with the invention defined in claim 13, the angle between the median plane of the human reference listener and the line connecting acoustic centers of the first transducer structure and the second transducer is substantially zero degrees. Now, the two transducer structures do not cause any binaural signal difference.

In an embodiment in accordance with the invention defined in claim 14, if both the first and the second transducer structures have either the uni-axial or toroidal polar response pattern, the angle between the first axis and the second axis is selected to be substantially 90 degrees, and the angle between said median plane and either the first or the second axis is also selected to be substantially 90 degrees. And, if the first transducer structure has the uni-axial polar response pattern and the second transducer structure has the toroidal polar response pattern, the angle between the first axis and a plane perpendicular to the second axis is selected to be substantially 90 degrees, and the angle between said median plane and either the first axis or the plane perpendicular to the second axis is selected to be substantially 90 degrees. With this positioning of the transducer structures, one of the transducer structures has at least a main particle velocity vector directed substantially in parallel with the median plane and the other one of the transducer structures has at least a main particle velocity vector directed substantially perpendicular to the median plane.

In an embodiment in accordance with the invention defined in claim 15, the first and second transducer structures contain transducers being pistonic or bending wave converters having flat or convex transducer elements. This type of transducer elements has a directional response pattern which slopes more continuously with frequency than concave cones. A more stable directional response pattern over the relevant frequency range improves the coherent behavior of the transducers and a maximum interference of the two wave fronts is achieved.

In an embodiment in accordance with the invention defined in claim 16, the first and/or second acoustic transducers contain a plurality of concentric membranes for generating a plurality of sub-sound waves for different frequency bands, respectively. The concentricity of the plurality of membranes improves the coherent behavior of the transducers over the frequency range.

In an embodiment in accordance with the invention defined in claim 17, the first and/or second acoustic transducers structures are rotational symmetric around the first or second axis, respectively. This causes spectral signatures of these structures which are congruent (preferably, but not essential: identical) in their respective directions and which will generate a maximum interference by the positioning of the structures in accordance with the present invention. Preferably, the enclosure constructions have similar dimensions and shapes and thus similar baffle steps.

In an embodiment in accordance with the invention defined in claim 18, the first and the second acoustic transducers each comprise at least one loudspeaker. In a loudspeaker arrangement in which the two loudspeaker boxes are positioned in accordance with embodiments of the present invention, the spectral signature of the loudspeaker boxes is masked and thus not or less perceived by the listener.

In an embodiment in accordance with the invention defined in claim 19, the sound system further comprises at least one amplifier which supplies a same electrical signal to the first and the second loudspeaker boxes. The loudspeakers used may be connected in parallel or in series. If a single loudspeaker is used at the different positions this is straight forward. If multiple concentric loudspeakers are used at the different positions, the speakers corresponding to the same frequency range may be interconnected in parallel or series via a common cross-over network.

In an embodiment in accordance with the invention defined in claim 20, the first and the second transducer structures each comprise at least one microphone. In a microphone arrangement with two microphones at the two positions in accordance with embodiments of the present invention, the spatial-spectral contour of the microphones is masked in the resulting wave form envelope and thus will add less colorization to the sound recorded. It is alternatively possible to use a set of microphones at one or both the positions dependent on which polar radiation pattern is desired.

In an embodiment in accordance with the invention defined in claim 22, the sound system further comprising an audio recorder device and a storage medium for storing a first signal registered by the first microphone and a second signal registered by the second microphone. These first and second signals can be used to drive the loudspeakers which are arranged in a reciprocal configuration with respect to the microphone configuration. Now, the sound produced by the loudspeaker arrangement at the position of the listener is minimally colored because both the spatial-spectral contours of the microphones used to record the original sound as the spectral signature of the loudspeakers reproducing the sound are masked In an embodiment in accordance with the invention defined in claim 25, the first acoustic transducer structure comprises at least one loudspeaker and the second acoustic transducer at least one microphone. The off axis directional polar response patterns of the loudspeaker at the one hand and the directional polar response of the at least one microphone provide the possibility to increase the amplification of the sound recorded by the microphone before it is fed to the loudspeaker. The normalization of the off-axis frequency responses of the two transducers, on 45 degrees off axis of both speaker and microphone, is maintained for a reference listener generating the sound source to be recorded. This improves the feedback loop stability and thus enables the usability in a conference system because their spatial-spectral contours are diffused in the resulting wave fronts.

In an embodiment in accordance with the invention defined in claim 26, the loudspeaker has a flat or convex membrane, and the second acoustic transducer comprise a plurality of microphones arranged and interconnected via a phase/shifting to obtain a toroidal polar response pattern with the second axis in line with the first axis. This system has the advantage that the polar response pattern of the microphone combination has a maximum in a plane substantially perpendicular on the axis which directs in the maximum of the polar response pattern of the loudspeaker. This allows maximizing the amplification of the microphone signal, especially in reverberant environment because the power response of the system is flat, which increases the system's feedback stability.

In an embodiment in accordance with the invention defined in claim 28, a multi-channel sound system comprising for at least two channels, a sound system as claimed in claim 1. Thus, instead of using for the channels a single speaker or a speaker box with speakers which all are directed in the same direction, now in fact two speaker boxes are used which are positioned such that the speakers which point in different directions do not directly point to the listener and are positioned and driven in such a manner that their wave fronts are coherent at the position of the listener. Alternatively, the two speakers may be arranged in a single box. In fact two equivalent sound apertures are used which are directed in different directions.

In an embodiment in accordance with the invention defined in claim 29, the laterally displaced with respect to the median plane left and a right channel of a stereo sound system each comprise the two transducer structures. Preferably, the corresponding first or the corresponding second acoustic transducers are identical (and thus have the same baffle step) and have substantially oppositely directed first or second axes. Or said differently, these transducers are looking towards each other.

In an embodiment in accordance with the invention defined in claim 32, the acoustic transducers in the multi-channel audio system are loudspeakers, and at least part of the signal for a sub-woofer channel is divided over the other loudspeakers. Now less power is required and room-modes are exited more evenly.

DESCRIPTION OF EMBODIMENTS

The same references in different Figures refer to the same items.

Figure 1:
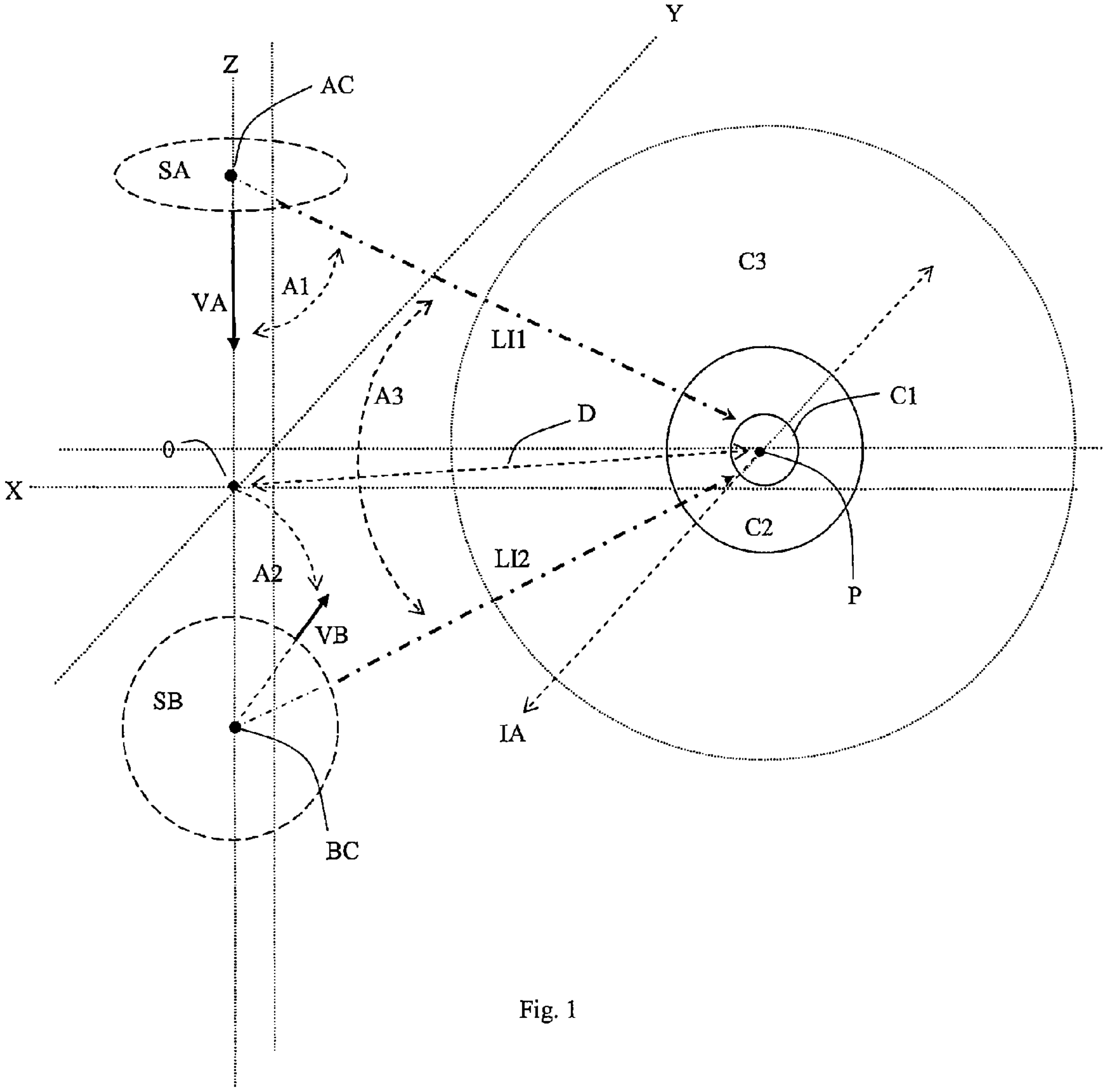
FIG. 1 schematically shows a positioning of the sound transducer structures with respect to a reference listener, FIG. 2 schematically shows a loudspeaker arrangement, in which two loudspeakers which are present at the same side of an ear are directed towards each others acoustic centre, FIG. 3 schematically shows a loudspeaker arrangement, in which two loudspeakers which are present at the same side of an ear are directed in different directions in accordance with the invention, FIG. 4 schematically shows an audio system in accordance with an embodiment of the invention which comprises a loudspeaker with a pistonic convex cone and a uni-axial radiation pattern and a bending wave loudspeaker with a toroidal polar pattern, FIG. 5 schematically shows a setup of two audio systems in accordance with the invention.

FIG. 1 schematically shows a positioning of the sound transducer structures with respect to a reference listener. FIG. 1 shows an imaginary Cartesian X, Y, Z coordinate system which enables to define the positions and directions of the two sound transducer structures SA, SB with respect to a particular position P which is referred to as the position of a virtual reference listener. The sound transducer structures SA, SB which comprise the sound transducers and their enclosures (not shown in FIG. 1) are in the now following also referred to as transducers. It will be clear from the context whether the actual transducers or the actual transducer structures are meant. The transducer structures SA, SB may comprise more than one transducer. If the transducers are loudspeakers, the virtual reference listener may be a real listener. If the transducers are microphones, the virtual reference listener is at the position where the recorded signals by the microphones expect the listener to be when listening to the recorded signals.

In the now following the positioning and the operation of the constellation of FIG. 1 is elucidated for embodiments wherein the sound transducers SA, SB are speakers and the listener is expected to be present at the particular position P. The pinna of the ear of the listener is schematically indicated by a circle C1, the head of the listener is schematically indicated by a circle C2, and the median plane of the listener is schematically indicated by the circle C3. The median plane C3 is in FIG. 1 arranged in parallel with the XZ plane. The listener has an inter-aural axis IA which extends through his ears and which thus extends perpendicular to the median plane C3. In FIG. 1, the inter-aural axis IA extends parallel to the Y axis. In the now following the situation will be elucidated for a first embodiment in which the acoustic transducers SA, SB are speakers. It will be clear that a reciprocal reasoning applies to the reciprocal embodiment in which the microphones are present instead of the loudspeakers. Alternatively it is possible that one of the sound transducers SA, SB is a loudspeaker and the other one of the sound transducers SA, SB is a microphone or a microphone arrangement.

In the embodiment shown in FIG. 1, only one ear is shown and only one set of two speakers which convey an information channel to the ear. The information channel may comprise a mono signal which is supplied to both loudspeakers. The information channel may comprise different signals which have a common part. In a stereo setup, the set of speakers shown may receive the left channel audio signal and another set of two speakers has to be present to transmit (or radiate) the right channel audio signal. In a multi-channel setup, the corresponding multiple sets of two speakers have to be provided. It is possible to produce besides the usual lateral stereo sound also a vertical stereo sound by adding a difference signal to the common signal.

The speakers may convert the complete frequency range with a single sound transducer, or the speakers may comprise more than one sound transducer, each one for a different frequency band, as is usual in two or three way speakers. The sound transducers of different speakers for the same frequency band have to be positioned as claimed in claim 1 for every frequency band. Preferably, all or a sub-set of the transducers of the same speaker are arranged concentrically. Preferably, the transducers for the high frequency range and the mid frequency range are arranged concentric. In the literature, the transducers are also referred to as drivers.

In the embodiment shown in FIG. 1, the two transducers SA and SB are present on the Z-axis, the ear is present at a distance D from the origin O, and the inter-aural axis runs parallel to the Y-axis. The transducer SA is directed towards the origin O, thus its main particle velocity vector VA lies on the Z-axis and points towards the origin O. The transducer SB is directed to obtain a main particle velocity vector VB which has a direction parallel to the Y-axis. In fact, the transducer SA is directed towards the particular position P but not directly: a non-zero angle A1 is present between the particle velocity vector VA and the imaginary line LI1 which connects the centre of the driver SA with the center of the ear which is the particular position P. The transducer SB is directed towards the particular position P but not directly: a non-zero angle A2 is present between the particle velocity vector VB and the imaginary line LI2 which connects the centre of the transducer SB with the particular position P. The distance between the transducer SA and the transducer SB determines an angle A3 between the lines LI1 and LI2.

In a preferred embodiment, the distance between the transducer SA and the transducer SB is selected to obtain an angle A3 between 10-170 degrees. The angles A1 and A2 are selected such that taking the radiation patterns of the transducers SA and SB into account, the sound waves are phase coherent at the particular position P. With phase coherent sound waves is meant that the sound frequencies of the respective transducers SA, SB reach the particular position P with substantially constant phase difference over the relevant frequency range. Preferably, the intensity ratio of the sum part of the sound waves emitted by the transducers SA and SB is substantially equal to one. The relevant frequency range is the range of frequency which is required to obtain auditory masking of the spectral signature of the transducers. Usually this range at least covers two to five octaves of the high and mid frequency ranges. Preferably the angles A1 and A2 are between 30 and 60 degrees. Preferably, the Z-axis extends in the vertical direction.

It has to be noted that FIG. 1 discloses a very specific embodiment only. For example the transducers SA and SB need not be positioned on a vertical line. The interconnection line between the transducers SA, SB may make an angle in a range between −20 to 20 degrees with the median plane. The angle between the velocity vectors VA and VB may deviate from substantially 90 degrees. Preferably, this angle is selected in a range from 70 to 110 degrees. The whole coordinate system XYZ may be rotated around the particular position P. For example, the transducers SA and SB may be present in substantially a horizontal plane above the particular position P, thus above the head of the listener. Further, the transducers SA and SB may be interchanged such that the transducer SA is directed to obtain a velocity vector VA parallel to the Y axis, and such that the transducer SB is directed to obtain a velocity vector on the Z-axis and pointing to the origin O. If the first and or second acoustic transducers comprise more than one transducer, the transducers which operate in the relevant frequency range should be positioned substantially concentric to obtain substantially overlapping acoustical centers to keep the phase coherence intact.

It has to be noted that FIG. 1 does not indicate that the nose of the listener should point towards the origin or towards the Y axis. Depending on the radiation pattern of the transducers SA and SB the coherent waves may converge exactly in the particular position only. A deviation from the particular position may cause the coherency of the sound waves received from the different transducers SA, SB to decrease. However, still the different directed particle velocity vectors cause counteracting particle velocity gradients across the pinna of the ear C1 and thus the spectral signature of the drivers and the cabinet of the drivers is masked to a large extend because the density of the resultant interference patterns is out of the resolution range of the outer ear's spectral coding abilities. Preferably the radiation patterns of the drivers SA and SB are selected such that at positions other than the particular position still the phases are substantially coherent for the common part of the information. Preferably, also the power of the common part of the information is substantially the same at the position P. For example, if the ear moves along a line parallel with the Z axis starting from the particular position in the positive Z direction, both radiation patterns may be selected to cause the power of both sound waves to decrease. A same effect occurs if the listener moves in another direction.

The two transducers SA, SB may have an identical uni-axial radiation pattern which has a maximum in the direction the transducer SA, SB is pointing and which is decreased in a direction perpendicular to the direction the driver is pointing. Preferably, the radiation pattern changes gradually from the maximum to a minimum value. The directivity may increase with an increasing frequency. Transducers which comprise a cone which is convex, thus dome shaped, have such a radiation pattern. Preferably, the cone protrudes out of the cabinet of the speaker. Such a radiation pattern indeed allows the listener to move away from the particular position while the phase coherence over the frequency range is substantially kept intact, and the intensity ratio of the two sound waves still is kept substantially constant. A similar however less optimal effect is reached with speakers with flat membranes, such as for example electrostatic speakers like the Quad ESL 63.

Both or one of the two transducers SA, SB may have a toroidal polar radiation pattern. Now, the maximum of the radiation pattern occurs in a plane substantially perpendicular to the rotational symmetry axis of the drivers. Such a plane is further referred to as the maximum plane. Because in such a maximum plane maximums of the radiation pattern occur which are perpendicular with respect to each other, such a transducer has already inherently some masking properties. But, in accordance with the invention, if the transducers SA, SB both have a toroidal polar radiation pattern, their symmetry axes are arranged under an angle in the range from 70 to 110 degrees and consequently, also the maximum planes have these same angles. Thus, by adding the second transducer, at least one maximum of the radiation pattern of the second transducer is directed to make the defined angle with the maximum plane of the other driver, thereby increasing the masking effect. In the same manner, if one of the transducers SA, SB has a uni-axial polar radiation pattern and the other has a toroidal polar radiation pattern the maximum of the uni-axial polar radiation pattern should be directed to make the defined angle with the maximum plane of the toroidal polar radiation pattern.

In the prior art, wherein only one loudspeaker, or more generally, one acoustic transducer centre is present, the ear is confronted with a single sound wave front only and is able to determine the origin of the sound which is distorted by the spectral signature of the speaker and its encasing. In accordance with the invention the outer ear and more specific the pinna of the ear receives two sound wave fronts which represent the same information and which have differently directed main particle velocity vector gradients. These differently directed main particle velocity vector gradients together with the phase coherence of the common information prevent the ear to detect the signature of the two sound sources. The sound sounds more natural and the apparent volume of the sound generating items of the original sound stage are reproduced more precisely without being limited in their dimensions by the dimensions of the drivers. It has been experienced that unmasking the dimensionality of the target source increases the distinction of timbre and spatial contrasts which by necessity improves the detection of residue pitch while increasing loudness. Residue pitch is defined in B. C. J. Moore, An Introduction to the Psychology of Hearing, 4th Ed., Academic, San Diego (1997) p. 188.

The vectors from the respective acoustic centers of the transducer structures SA, SB in the off-axis direction are further referred to as the off-axis vectors. At the position of the human reference listener P, where these off-axis vectors intersect, the flat or convex membrane transducers generate phase coherent wave fronts for the common information. With coherent wave fronts is meant that the wave fronts are related to, or composed of, waves having a constant difference in phase over the relevant frequency range. Coherent sound comprises wave components which are coherent with respect to each other, while, in contrast, diffuse sound consists of waves which all have a randomized difference in phase over the frequency range.

In the prior art wherein the loudspeakers, which are positioned at a same side of the median plane have different angles but create diffuse sound due to interference, the gradients of the particle velocities may have different angles on the pinna of the ear but, due to the uncontrolled interference at the sound source, the coherency of the signals from the different loudspeakers is lost and masking effect is deteriorated. It is thus required that the transducer structures SA, SB each generate phase coherent waves for the common part of the information, at least in the direction of the position where the human reference listener P is present.

Figure 2:
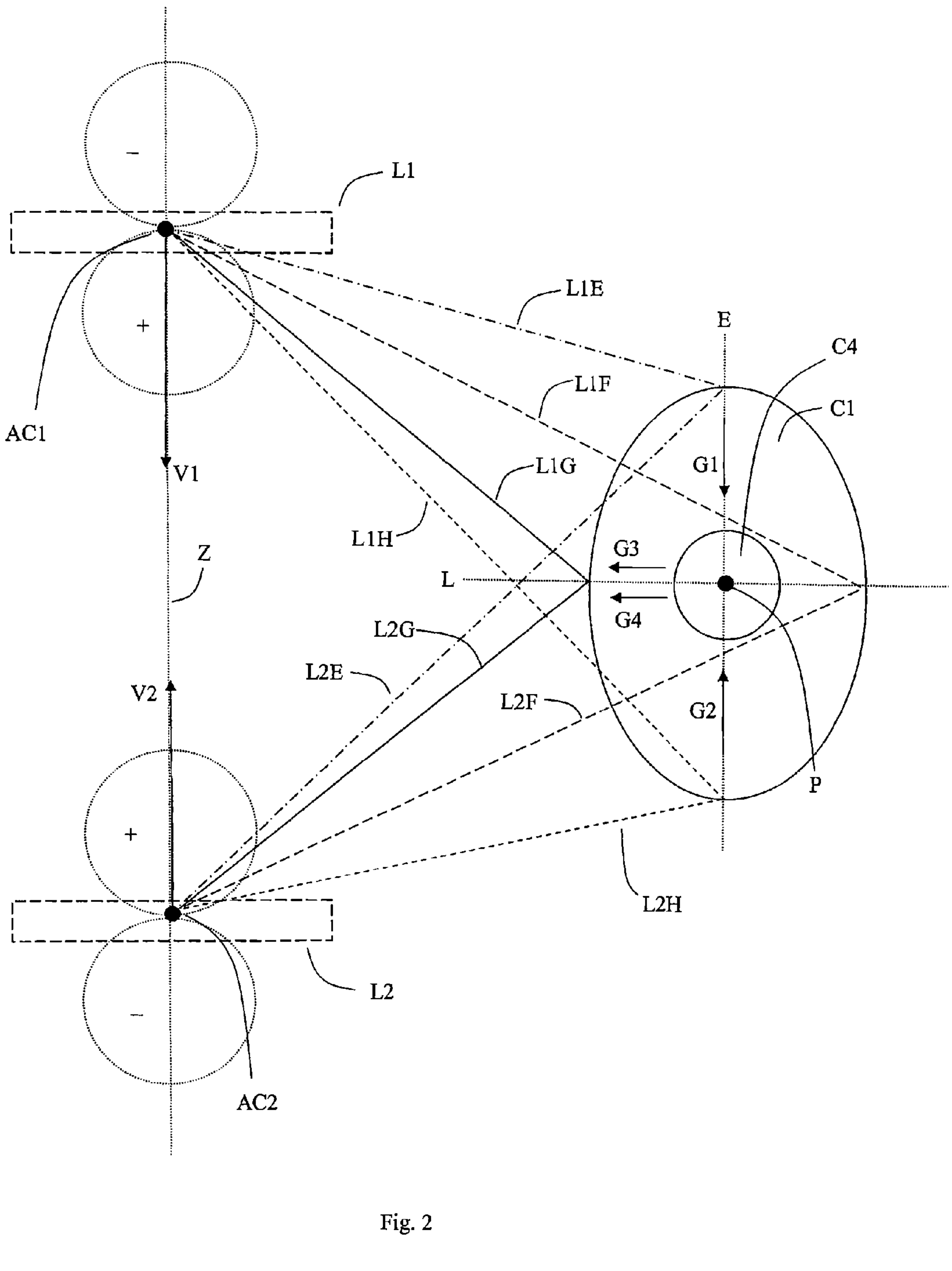

FIG. 2 schematically shows a loudspeaker arrangement in which two loudspeakers, which are present at the same side of an ear, are directed in the towards each others acoustic centers. Such a positioning of loudspeakers with a convex cone is disclosed in DE-A-19605130.

The loudspeakers L1 and L2 have acoustic centers AC1 and AC2, respectively. The uni-axial polar radiations patterns of the loudspeakers L1 and L2 are indicated by the circles through the acoustic centers AC1 and AC2. The main particle velocity vectors V1 and V2 of the loudspeakers L1 and L2, respectively, are directed to the acoustic centers AC2, AC1, respectively. The pinna C1 of the ear is stylistically shown as a ellipse C1, and the auditory canal by the circle C4. The larger dimension of the ear occurs in its vertical direction along the line E, the smaller dimension of the ear occurs in its horizontal direction along the line L. It has to be noted that only one ear is shown and that thus only monaural hearing is addressed. The dimensions of the ear are largely exaggerated and schematically limited to the pinnae to clearly point out the effect reached. The effect on the pinnae can be extrapolated to the complete outer ear, involving head and torso, which is relevant for lower frequencies. Further, it is assumed that a mono signal is supplied to the loudspeakers L1 and L2.

The lines L1E and L1H connect the acoustic center AC1 of the loudspeaker L1 at intersections of the border of the pinna C1 with the line E. The lines L1E and L1H indicate respective particle velocity vectors of the loudspeaker L1 towards the pinna C1. The lines L2E and L2H connect the acoustic center AC2 of the loudspeaker L2 at intersections of the border of the pinna C1 with the line E. The lines L2E and L2H indicate respective particle velocity vectors of the loudspeaker L2. The gradient G1 of the particle velocity at the pinna C1 along the line E due to the particle velocity vectors L1E and L1H has the opposite direction of the gradient G2 of the particle velocity at the pinna C1 along the line E due to the particle vectors L2E and L2H. The gradients G1 and G2 result from the polar response patterns. For the loudspeaker L1, the line L1E intersects the polar response pattern nearer to the acoustic center than the line L1H. Consequently, the particle velocity increases when moving on the line E from the intersection with the line L1E to the line L1H. Based on a corresponding reasoning for the loudspeaker L2, the particle velocity increases when moving on the line E from the intersection with the line L2H to the line L2E as indicated by the gradient G2.

The lines L1G and L1F connect the acoustic center AC1 of the loudspeaker L1 at intersections of the border of the pinna C1 with the line L. The lines L1G and L1F indicate respective particle velocity vectors of the loudspeaker L1 towards the pinna C1. The lines L2G and L2F connect the acoustic center AC2 of the loudspeaker L2 at intersections of the border of the pinna C1 with the line L. The lines L2G and L2F indicate respective particle velocity vectors of the loudspeaker L2. The gradient G3 of the particle velocity at the pinna C1 along the line E due to the particle velocity vectors L1G and L1F has the same direction as the gradient G4 of the particle velocity at the pinna C1 along the line L due to the particle vectors L2G and L2F. The gradients G3 and G4 result from the polar response patterns in a same manner as the gradients G1 and G2. For the loudspeaker L1, the line L1F intersects the polar response pattern nearer to the acoustic center than the line L1G. Consequently, the particle velocity increases when moving on the line L from the intersection with the line L1F to the line L1G. For the loudspeaker L2, the particle velocity increases when moving on the line L from the intersection with the line L2F to the line L2G as indicated by the gradient G4.

The result of the common direction of the gradients G3 and G4 is that the pressure decreases with increasing distance between the position P and the interconnect line Z. This gradient in intensity is exploited by the binaural hearing system to detect the distance to the source and thus to localize the source. It is much less likely that the listening position changes significantly in the direction along the line E where the gradients are counteracting each other and cause a plane wave. Further, due to the opposite direction of the gradients G1 and G2, the spectral signature of the loudspeakers is clearly audible, because the two transducers create one stretched virtual source with a distinct timbre that reflects the sum of the spectral signature related angular transfer functions that each are differently encoded by the ear. The present invention is based on the insight that the gradients G3 and G4 should have opposite directions and the gradients G1 and G2 should be directed in the same direction. Or said in other words, the gradients G1 and G2 should have equally directed components or at least components which have a sufficiently small angle such that the ear is confused about the origin of the sound.

If the same loudspeaker configuration is used in binaural hearing, the loudspeakers have to be moved to the front of the listener such that the line connecting the acoustic centers AC1 and AC2 extends perpendicular on the median plane, and the loudspeakers L1 and L2 have to be rotated such that the velocity vectors V1 and V2 are directed substantially in parallel with the median plane of the listener. If now a stereo signal is supplied to the loudspeakers, a usual stereo arrangement is obtained. In contrast to the mono configuration each ear is only directly receiving one loudspeaker signal and the other indirectly via the baffle of the head. Thus at each ear one of the particle velocity gradients is predominant and causes a high amount of colorization of the sound due the spectral signature of the loudspeaker. Due to the different sound at the two ears, the sum-location processing of the ears and brain perceive phantom sources in-between the loudspeakers, which however, are distorted by the spectral signatures of the loudspeakers. The colorization can easily be detected by monaurally listening or by moving away from the sweet spot. The binaural system is requires heavy processing to rule out the perceived coloration and image ambiguity.

Figure 3:
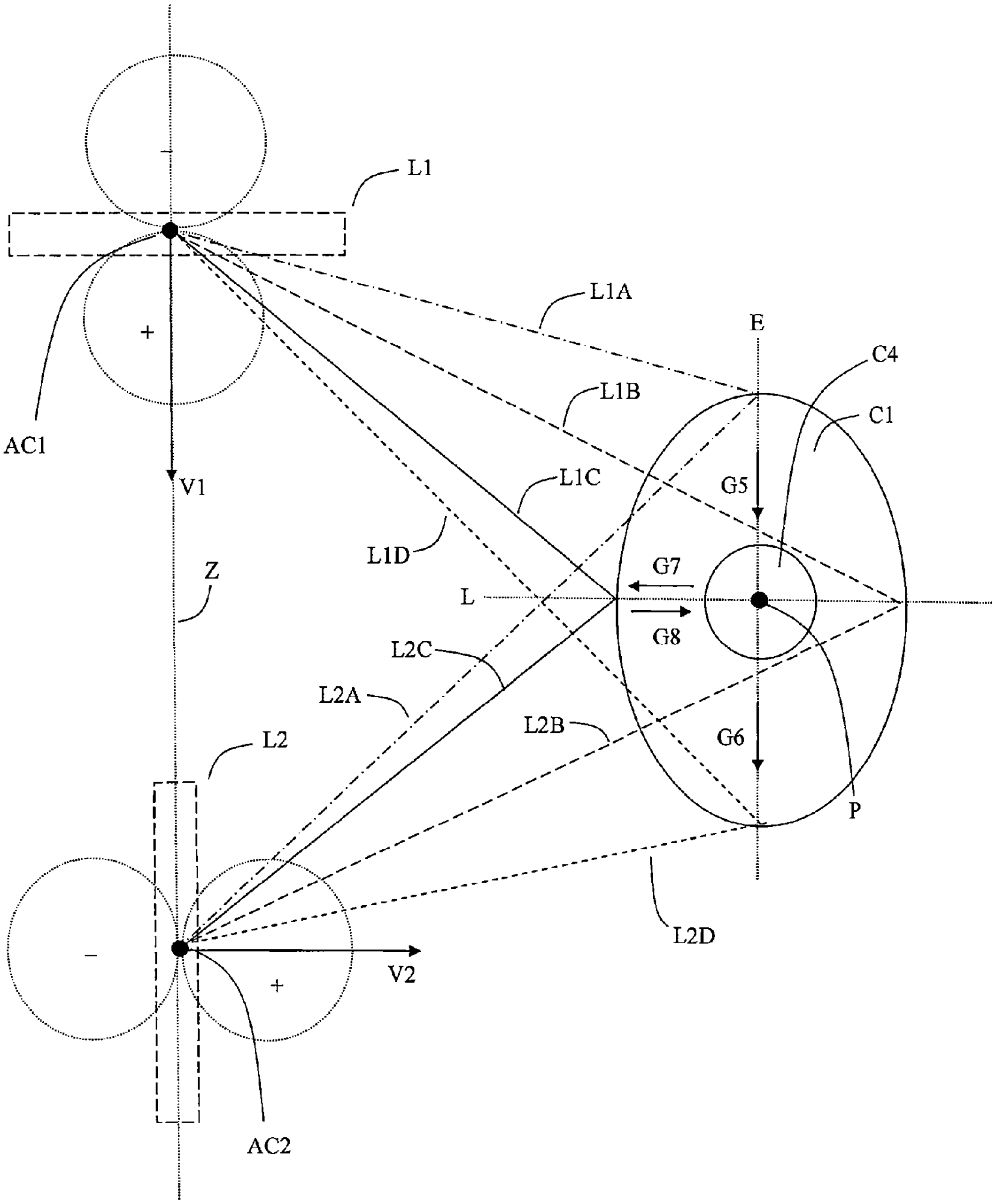

FIG. 3 schematically shows a loudspeaker arrangement in which two loudspeakers which are present at the same side of an ear are directed in different directions in accordance with the invention. FIG. 3 is based on FIG. 2 wherein the loudspeaker L2 is rotated such that the main particle velocity vector V2 of the loudspeaker L2 is directed perpendicular to the median plane of the listener. The particle velocity vector V1 is still directed to the acoustic center AC2 of the loudspeaker L2.

The lines L1A and L1D, which indicate respective particle velocity vectors of the loudspeaker L1 towards the pinna C1, connect the acoustic center AC1 of the loudspeaker L1 at intersections of the border of the pinna C1 with the line E. The lines L2A and L2D, which indicate respective particle velocity vectors of the loudspeaker L2 towards the pinna C1, connect the acoustic center AC2 of the loudspeaker L2 at intersections of the border of the pinna C1 with the line E. The gradient G5 of the particle velocity at the pinna C1 along the line E due to the particle velocity vectors L1A and L1D has the same direction as the gradient G6 of the particle velocity at the pinna C1 along the line E due to the particle vectors L2A and L2D.

The lines L1B and L1C, which indicate respective particle velocity vectors of the loudspeaker L1 towards the pinna C1, connect the acoustic center AC1 of the loudspeaker L1 at intersections of the border of the pinna C1 with the line L. The lines L2B and L2C, which indicate respective particle velocity vectors of the loudspeaker L2 towards the pinna C1, connect the acoustic center AC2 of the loudspeaker L2 at intersections of the border of the pinna C1 with the line L. The gradient G7 of the particle velocity at the pinna C1 along the line E due to the particle velocity vectors L1B and L1C has the opposite direction as the gradient G8 of the particle velocity at the pinna C1 along the line L due to the particle vectors L2B and L2C.

It has to be noted that the positioning of the loudspeakers L1 and L2 in accordance with an embodiment of the invention, as shown in FIG. 3, causes on the pinna vertical gradients which are directed in the same direction and horizontal gradients which are oppositely directed. This in contrast to the prior art positioning, as shown in FIG. 2, where the vertical gradients are oppositely directed and the horizontal gradients have the same direction. These differently directed gradients coherently acting in different directions on the pinna may explain why the positioning in accordance with the invention sounds much less colored than the prior art positioning. Further, besides these differences in the directions of the gradients, the intensity of the wave front does not depend much on the distance between the position P and the interconnect line Z. The arrangement now produces a plane wave which for the hearing system relates to a diffuse field that is colorless by necessity. The hearing system now is forced to obtain directional information from the source signal as the loudspeakers are not anymore localizable. It has to be noted that in a stereo setup, a further set of two speakers is required which is positioned at the other side of the median plane of the listener with an ear at the position P than the already present set. Further, as elucidated with respect to FIG. 1, the configuration shown in FIG. 3 is a preferred embodiment only, and many alternatives exist. It is clear that the masking of the spectral signature is already obtained, be it somewhat less pronounced, if the gradients G5 and G6, G7 and G8 make an angle with respect to each other.

It has to be noted that in FIGS. 2 and 3, the polar response patterns are schematically drawn; the actual patterns are three dimensional and vary with frequency. The actual polar response patterns depend on the transducers used. For example, in FIG. 4, for a particular frequency range, the transducer shown at the top has a kidney shaped uni-axial polar response patterns, while the transducer shown at the bottom has a toroidal polar response pattern.

Figure 4:
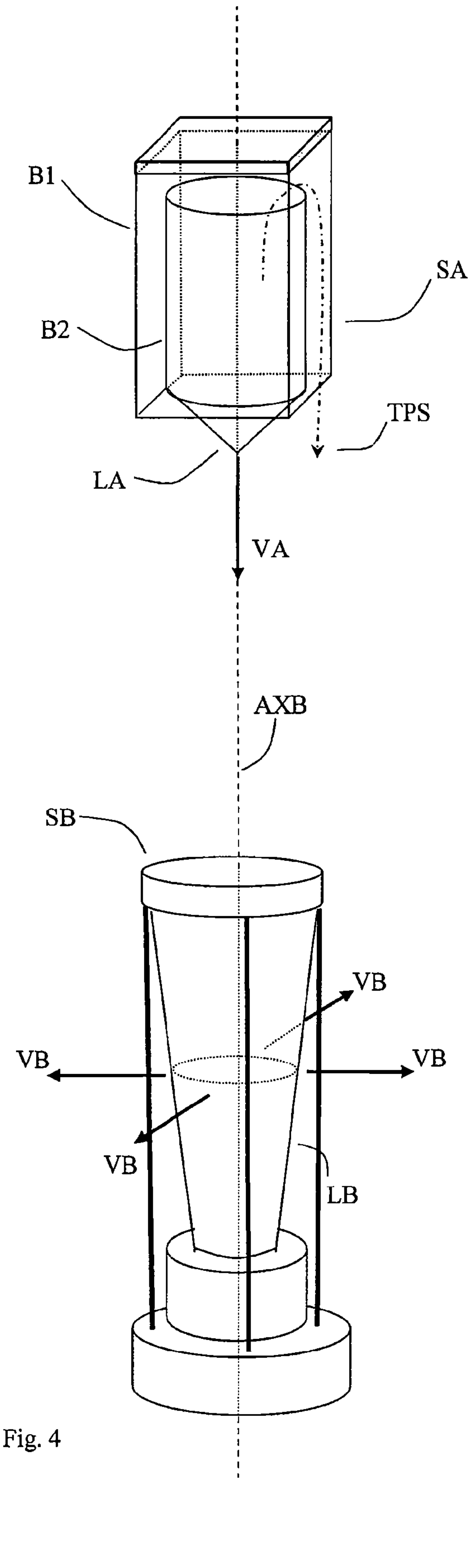

FIG. 4 schematically shows an audio system in accordance with an embodiment of the invention which comprises a transducer with a pistonic convex cone and a uni-axial polar radiation pattern and a bending wave transducer with a convex cone and a toroidal polar radiation pattern. The latter transducer may be turned upside down.

The acoustic transducer structure SA comprises the driver LA with a pistonic convex cone, and an encasing B1, B2. In the embodiment shown, the encasing of the driver LA comprises a cylindrical part B2 which holds at one end the driver LA and which at the other end is at least partly open. For example, the opposite end is completely open or is provided with holes. Additionally or instead, holes may be provided in the side wall at the opposite end. The cylindrical part B2 is arranged within a box B1 with a square cross-section with dimensions such that the cylindrical box B2 is tightly clamped. A free space exists between the opposite side of the cylindrical box B2 and the adjacent wall of the square box B1 such that the sound can travel in the free space between the two boxes B1 and B2 and a front firing bass reflex port is obtained. One of the four travel paths of the sound is indicated by the arrow TPS. Such a construction is very compact, stiff and simple: a single screw (not shown) extending from the closed end of the box B1 may fix the driver LA. The maximum of the polar radiation pattern or the main particle velocity vector is indicated by the arrow VA. The pistonic driver with a convex cone as such is known from U.S. Pat. No. 4,590,333.

The acoustic transducer structure SB comprises the bending wave driver LB which as such is known from U.S. Pat. No. 3,424,873. The bending wave driver LB has a toroidal polar radiation pattern, and thus the maxima of this radiation pattern are substantially directed in a plane perpendicular to the rotational symmetry axis AXB of the driver LB. The arrows VB indicate four vectors which lie in this plane.

By way of example only, the system of the two loudspeakers LA and LB is arranged in a vertical direction. Preferably, the vector VA and the axis AXB are positioned on the same line, but an offset is allowed as long as both drivers LA, LB are present at the same side of the median plane of the listener. The drivers LA and LB may be hold in different boxes B1, B2, and SB, respectively, which are held in their position by a vertical stand (not shown), or may be incorporated in a single encasing.

As is clear from FIG. 4, the maximum direction of the uni-axial polar radiation pattern of the acoustic transducer structure SA with the driver LA is arranged substantially perpendicular to the plane in which the maximum directions of the toroidal polar radiation pattern of the acoustic transducer structures SB with driver LB lie.

The driver LA with the uni-axial polar radiation pattern may be exchanged by a driver with a toroidal polar radiation pattern of which the rotational symmetry axis extends substantially perpendicular with respect to the rotational symmetry axis AXB of the driver LB. Consequently, now the planes of the maxima of the two toroidal polar radiation patterns extend substantially perpendicular with respect to each other. Alternatively, the driver LB with the toroidal polar radiation pattern may be exchanged by a driver with a uni-axial polar radiation pattern with a maximum in a direction extending substantially perpendicular to the vector VA.

In a practical setup which proved the remarkable effect reachable with an embodiment in accordance with the invention, the vertical distance between the drivers LA and LB was in the range of 1 to 3 meters if the ear of the listener was in a range of 3 to about 10 meters from the connection line on which the vector VA and the axis AXB lie. The sound clearly sounded if no drivers are present at all, while the positioning of the target sound was extremely spacious without loose of pin-point imaging and without being increasingly affected by room acoustics when increasing the distance of the listening position.

Again, it should be noted that the embodiment shown in FIG. 4 is a preferred embodiment only and that many alternatives exist as is discussed with respect to FIG. 1. The main item is that the spectral signatures of the structures SA and SB are masked at the ear of the listener by positioning the two structures such that their maxima of the polar radiation patterns have non-overlapping directions which at least differ 30 degrees and which generate in-phase and coherent sound in the direction of the listener for the information which is common for the two loudspeakers. These two aspects together cause different gradients of the sound of the different drivers LA, LB at the same ear of the listener, while the information which reaches the ear from the different drivers LA, LB is still phase coherent and not blurred by uncontrolled interference.

Figure 5:
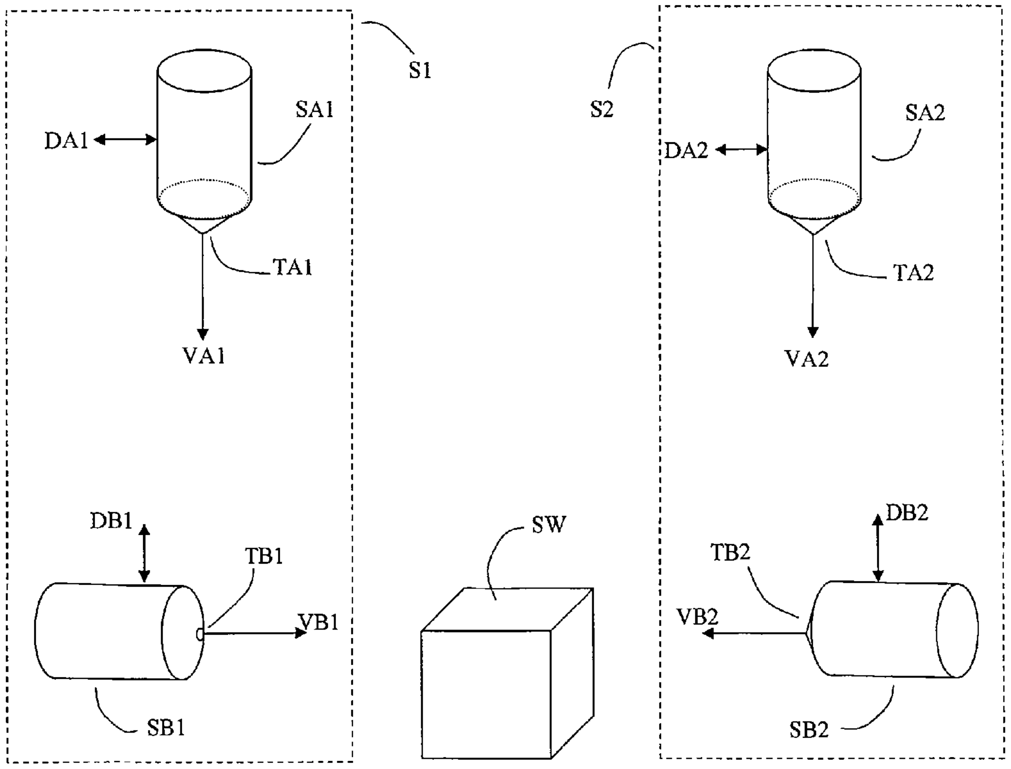

FIG. 5 schematically shows a setup of two audio systems in accordance with the invention.

The audio system S1 comprises an acoustic transducer structure SA1 and an acoustic transducer structure SB1. The acoustic transducers structure SA1 comprises a transducer TA1 with a convex cone and has a uni-axial polar radiation pattern of which the maximum is directed in the direction indicated by the arrow VA1. The signal fed to or received from the transducer TA1 is stylistically indicated by DA1. The acoustic transducers structure SB1 comprises a transducer TB1 with a convex cone and has a uni-axial polar radiation pattern of which the maximum is directed in the direction indicated by the arrow VB1. The signal fed to, or received from, the transducer TB1 is stylistically indicated by DB1. The angle between the arrows VA1 and VB1 is substantially 90 degrees.

The audio system S2 comprises an acoustic transducer structure SA2 and an acoustic transducer structure SB2. The acoustic transducers structure SA2 comprises a transducer TA2 with a convex cone and has a uni-axial polar radiation pattern of which the maximum is directed in the direction indicated by the arrow VA2. The signal fed to or received from the transducer TA2 is stylistically indicated by DA2. The acoustic transducers structure SB2 comprises a transducer TB2 with a convex cone and has a uni-axial polar radiation pattern of which the maximum is directed in the direction indicated by the arrow VB2. The signal fed to or received from the transducer TB2 is stylistically indicated by DB2. The angle between the arrows VA2 and VB2 is substantially 90 degrees.

The audio systems S1 and S2 are arranged in front of the listener, the system S1 at the left side of the median plane of the listener, and the system S2 at the right side of the median plane. In a multi-channel system (which also comprises a stereo system), the left channel signal is supplied to or received from the system S1 and the right channel signal is supplied to or received from the system S2. If the interconnection lines which interconnect the acoustic centers of the transducers substantially extend in the vertical direction, the distance of the acoustical centers of the transducers to the median plane is identical, and if all the transducers are identical, preferably the same left signal is supplied to the transducers TA1 and TB1, and the same right signal is supplied to the transducers TA2 and TB2. If the signals are recorded with the system shown wherein the transducers are microphones, the signals are fed to the corresponding transducers of the system which has to reproduce the recorded information. The recorded information may actually be recorded on a recording medium, it may also be directly transmitted or broadcasted. Preferably, if the transducers are loudspeakers, the head of the listener is present at the equal distance with respect to all the transducers. However, due to the selected polar radiation patterns, the position of the head may move relatively far away from this optimal position (often referred to as the sweet spot), this in contrast to the usual multi-channel systems. Or said differently, the sound image is more stable in space than with a usual setup.

Preferably, the four transducers TA1, TB1, TA2, TB2 are present in a same substantially vertical plane which extends substantially perpendicular to the median plane of the listener. Both the arrows VA1 and VA2 are directed downwards. Both the arrows VB1 and VB2 are directed horizontally, and point towards each other. Although preferably, the arrows VA1, VA2 point to the acoustical centers of the transducer VB1, VB2, respectively, an offset is allowed. For example, the transducers TA1, and TA2 may have a larger distance with respect to the median plane than the transducers TB1 and TB2. Further, it has to be noted that the tolerances with respect to the positioning of the transducers with respect to their optimal position, which are claimed and which are discussed with respect to FIG. 1, are allowed while still the desired effect shows an improvement over the prior art.

In the multi-channel system shown, if the transducers are loudspeakers, further an optional sub-woofer SW may be present.

If instead of a single driver, a plurality of drivers is used per acoustic transducer structure, preferably, these drivers are, as far as they convert the relevant frequency range, positioned concentric to preserve the phase coherency of the sound. Alternatively, the system may be subdivided in subsystems with mutual supplemental frequency bands.

These subsystems need not be positioned coaxial or coincident as long as their mutual position is according the specification of claim 1.

If loudspeakers are used in the systems shown in FIG. 4 and FIG. 5, it is not required to feed signals of different channels to the different systems S1 and S2. If a mono signal is supplied to the two systems, an array of systems is provided which produces a sound which has a low amount of colorization and which produces a stable sound image. The array may comprise more than two systems S1, S2. For example, on a platform of a railway station or the stage of a theater, multiple systems shown in FIG. 4 are positioned in a line along the platform, eventually terminated with systems S1 and S2. Such a system provides an improved clarity of speech because in such a setup, the position and the moving direction of the listener is not of influence at all. Such a multiple of sound systems may also be connected respectively to different signal channels, for instance to generate surround sound. This also holds for multiple microphone systems in accordance with the present invention.

It further has to be noted that the signals supplied to the systems S1 and S2 need not be identical, it suffices that these signals have a common part: the sum signal.

Figure 6:
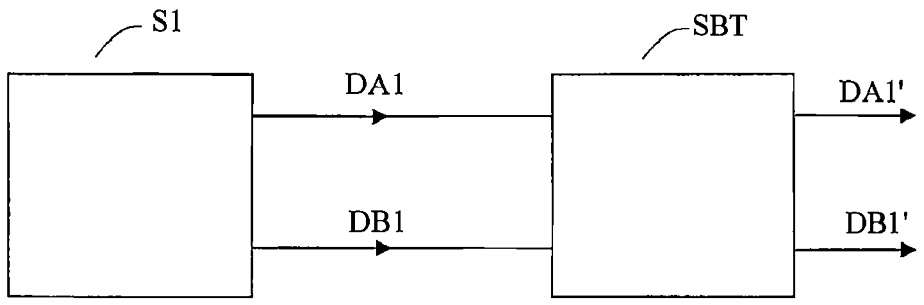
FIG. 6 shows a block diagram indicating signals generated by a microphone arrangement in accordance with the invention.

FIG. 6 shows a block diagram indicating signals generated by a microphone arrangement in accordance with the invention. The block S1 may comprise a microphone arrangement in which the microphones are positioned in accordance with an embodiment of the invention. For example, the microphones may be positioned as elucidated with respect to FIG. 1, 4 or 5. It is commonly known how microphones should be positioned and which type of microphones should be used to obtain the uni-axial and/or toroidal polar radiation patterns. Some examples are disclosed in U.S. Pat. No. 4,675,906.

If is assumed that the microphones are arranged as shown in the left hand system S1 of FIG. 5, the microphones supply the signals DA1 and DB1. A processing circuit SD receives the signals DA1 and DB1 and supplies processed signals DA1' and DB1'. The processing circuit SBT may comprise amplifiers to amplify the input signals DA1 and DB1. The processed signals DA1' and DB1' may be recorded as separate tracks on a recording medium (not shown) such as for example a CD, SACD, DVD. Alternatively, the two processed signals DA1' and DB1' may be transmitted or broadcasted. These signals may be used to drive two loudspeakers which are positioned correspondingly, as is discussed with respect to FIG. 7.

The processed signal DA1' and DB1' may be further processed to obtain a single signal which is used to drive both the loudspeaker of a set of loudspeakers in accordance with the invention with a same signal, or to drive a loudspeaker box of prior art setups.

Figure 7:
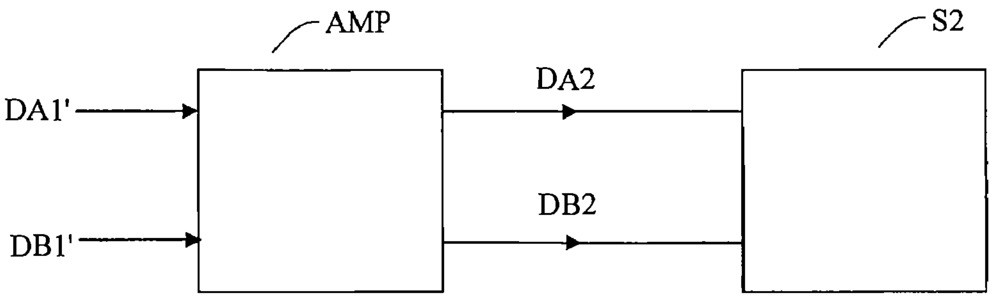
FIG. 7 shows a block diagram indicating signals generated by a loudspeaker arrangement in accordance with the invention, FIGS. 8A and 8B schematically shows a combination of microphones and a loudspeaker.

FIG. 7 shows a block diagram indicating signals generated by a loudspeaker arrangement in accordance with the invention. An amplifier block AMP comprises amplifiers for amplifying the input signals DA1' and DB1' which may be read from a storage medium, or which may be received by broadcast, as generated with the system shown in FIG. 6. If is assumed that the loudspeakers are arranged as shown in the right hand system S2 in FIG. 5, the amplified input signals DA2 and DB2 are provided to the system S2.

Alternatively the signals DA2 and DB2 supplied to the loudspeakers may be the same signals. It is also possible to process a mono signal or a signal representing a channel of a multi-channel signal to obtain different signals, this is especially relevant if the speakers do not have substantially equal distances to the listener to obtain equal arrival instants of the sum signal.

Figure 8A:
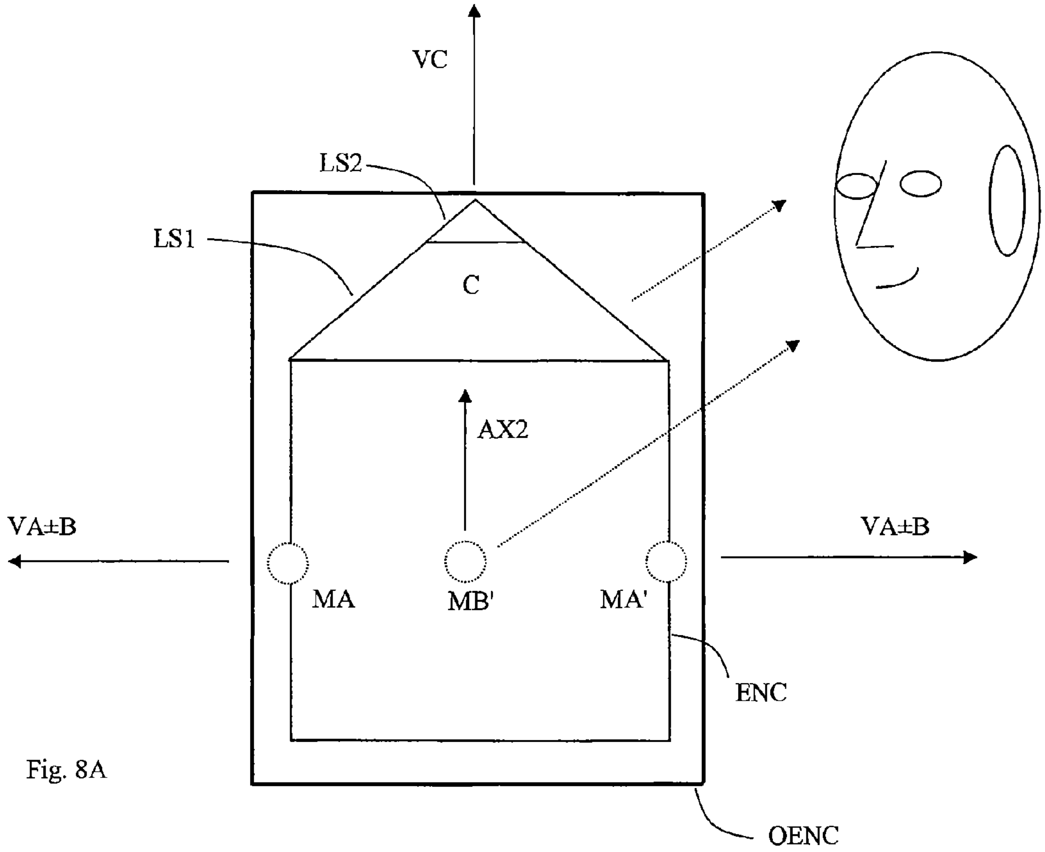
Figure 8B:
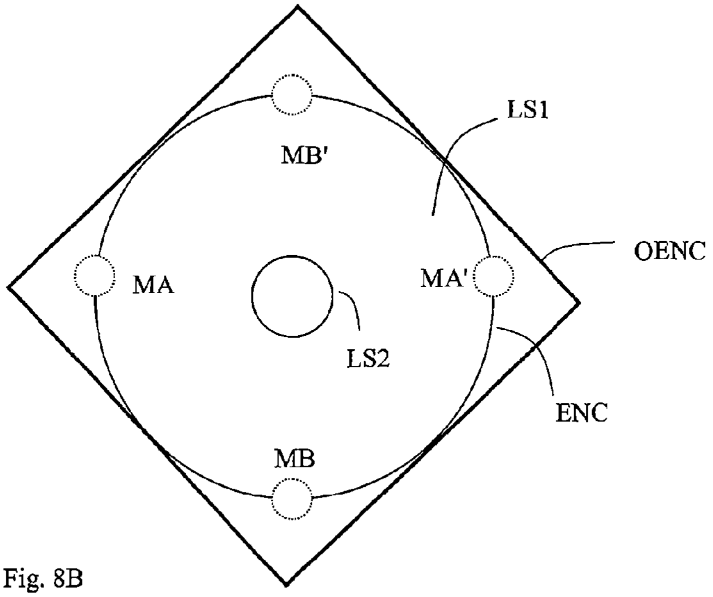

FIGS. 8A and 8B schematically show a combination of microphones and a loudspeaker mounted on a common structure providing congruent baffle steps for both transducers ensuring equivalent power responses and controlled equivalent pressure gradient slopes for both transducers. FIG. 8A shows a side view, and FIG. 8B a top view of a combination of a loudspeaker C, its encasing ENC and four microphones MA, MA', MB, MB'. The loudspeaker C comprises a tweeter LS2 which is arranged concentrically with a low/mid speaker LS1. Both speakers LS1, LS2 have convex cones which protrude out of the encasing ENC. Both speakers have a uni-axial polar radiation pattern of which the maximum is directed as indicated by the arrow VC. The microphones are arranged to obtain a toroidal polar radiation pattern in the plane substantially perpendicular to the arrow VC as is indicated by the arrows VA±B. The shown arrangement of four microphones is as such known from U.S. Pat. No. 4,675,906. The signals from the microphones MA, MA', MB, MB' are processed and amplified to drive the loudspeaker C. Because the maximum direction of the polar radiation pattern of the microphones MA, MA', MB, MB' is directed in a plane substantially perpendicular to the maximum direction VC of the polar pattern of the loudspeaker C and both transducers behave as rotation symmetrical coherent line sources with equivalent baffle steps, the roughness of their directional frequency responses will interfere into a wave front pattern with a very dense succession of minima and maxima which cannot anymore be resolved by the ear and the influence of the sound produced by the loudspeaker C on the microphones MA, MA', MB, MB' is minimal as is the reverberant feedback from the loudspeaker to the microphone due to room acoustics. Consequently, the amplification factor of the amplifier can be selected larger than in prior art systems because less colorization is generated.

The optional enclosure OENC prevents that a user is able to acoustically shield the microphones. This enclosure OENC may be an open construction which prevents to shield or damage the loudspeaker C and the microphones MA, MA', MB, MB'. If the side walls are not too open, the enclosure may be also be used as a bass port as is elucidated with respect to the acoustical transducer structure SA shown in FIG. 4. Of course, the side walls should be sufficiently open around the microphones MA, MA', MB, MB' to allow the sound to reach the microphones. MA, MA', MB, MB'. By way of example, the cross section of the encasing ENC may be circular, while the cross section of the encasing OENC is square. The square has dimensions to tightly clamp the circle. If the encasing ENC is recessed at the position of the microphones MA, MA', MB, MB' the dimension of the encasing OENC can be minimized. Preferably, the recess is circularly, and the microphones MA, MA', MB, MB' do not anymore protrude out of the encasing ENC.

Such a system can be advantageously used in a conference system, wherein usually the vector VC points in the vertical direction but where the optimized off-axes of both microphone and loudspeaker preferably points to all listeners. The convex loudspeaker LS provides a more evenly spread polar radiation pattern around the vector VC which does vary less over the frequency range relevant to speech than concave loudspeakers. This together with the higher possible amplification factor improves the understandability of speech. The conference system may be used to locally amplify the sound received by the microphones MA, MA', MB, MB' to supply this amplified sound to the speaker C. The conference system may also be used to pickup the sound of the locally participating conference members to transport this to a remote loudspeaker where remote participating conference members are present. The sound of the remote participating conference members is fed to the loudspeaker C.

Another interesting application is to replace at least one of the transducer structures SA1, SA2, SB1, SB2 in FIG. 5 with a combination of a loudspeaker and microphones as discussed with respect to FIGS. 8A and 8B. Now, the microphones may be coupled with a telephone system to broadcast sound (which may be speech) to a remote location. The sound from the remote location is fed to the loudspeaker of the loudspeaker/microphone combination. Preferably, two opposing acoustic structures have such a combination of loudspeakers and microphones. Other applications as for example in domotica are possible.

Figure 9:
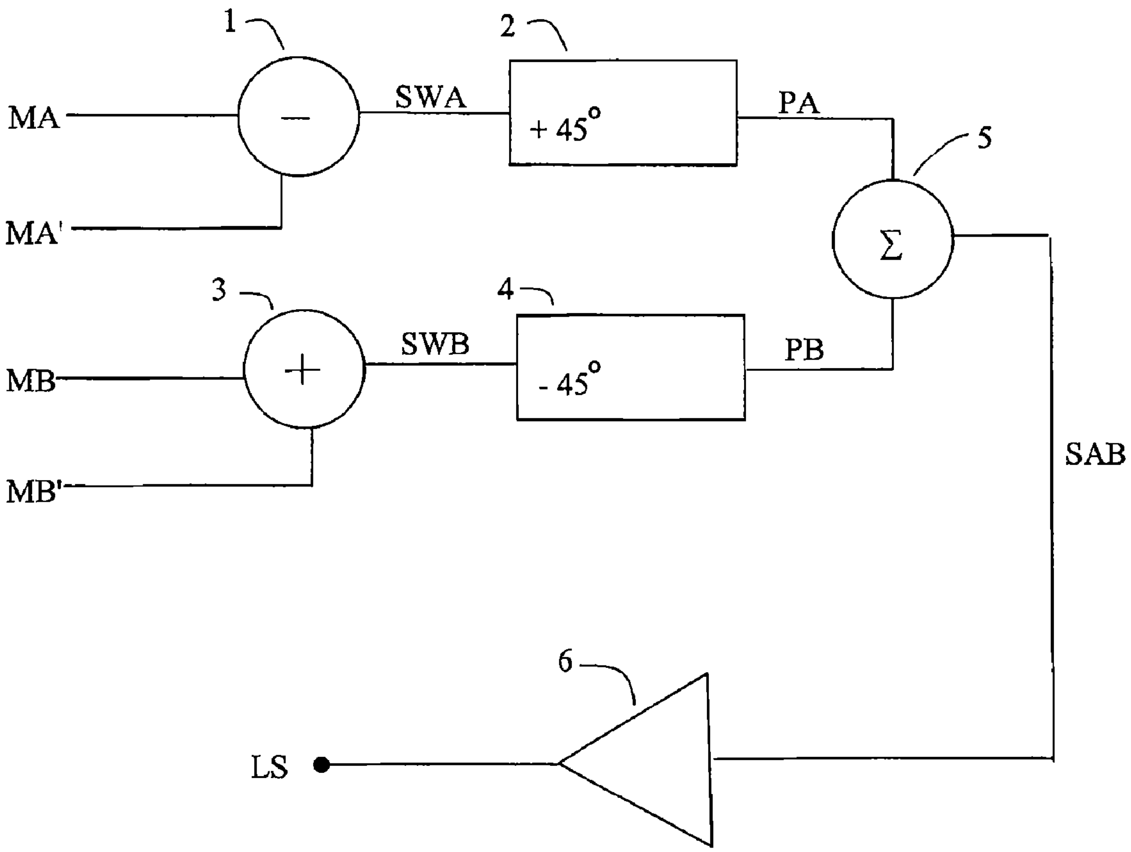
FIG. 9 shows a block diagram of a circuit for driving the speaker of FIG. 8 with the signals of the microphones.

FIG. 9 shows a block diagram of a circuit for driving the speaker of FIG. 8 with the signals of the microphones. A subtractor 1 subtracts the signals of the microphones MA and MA' to obtain a difference signal SWA. A subtractor 2 subtracts the signals of the microphones MB and MB' to obtain a difference signal SWB. The signal SWA is phase-shifted over +45 degrees to obtain the signal PA, and the signal SWB is phase-shifted over −45 degrees to obtain the signal PB. Other phase shifts are possible, what counts is that the phases of SWA and SWB are with respect to each other shifted over 90 degrees. The signals PA and PB are added to obtain the signal SAB which is fed to the amplifier 6. The amplified signal SAB is supplied to the loudspeaker C in a conventional manner. However, the amplified signal may instead be supplied to a loudspeaker at a remote location. The microphones are preferably pressure sensitive electret transducers.

To conclude, in a preferred embodiment in accordance with the invention, the sound system comprises two loudspeakers LA, LB which mask their spectral signatures at the ear C1 of the listener by positioning the two loudspeakers LA, LB such that their maxima of the polar radiation patterns have directions which at least differ 30 degrees, and which generate phase coherent sound in the direction of the listener for the common part of the signals supplied to the two loudspeakers. Further, both the loudspeakers LA, LB are present at the same side of, or in, the median plane of the (reference) listener. The loudspeakers LA, LB should be spaced apart to obtain sufficient different gradients of their sound at the same ear. These aspects together cause different gradients of the sound of the two loudspeakers LA, LB at the same ear C1 of the listener, while the information which reaches the ear C1 from the different loudspeakers LA, LB is still coherent and not blurred by diffusion.

Because microphones operate reciprocal to loudspeakers, in another embodiment in accordance with the invention the microphones can be positioned such that the baffle step defined maxima of their polar response patterns have directions which at least differ 30 degrees, and which have a coherent behavior for sound projected to a reference position which is called the position of the reference listener.

It should be noted that the above-mentioned embodiments illustrate rather than limit the invention, and that those skilled in the art will be able to design many alternative embodiments such as headphones, Multimedia—Theater—PA—TV—and PC speakers, paging systems, universal HRTF-coding microphones, microphone and loudspeaker arrays and combinations of them, without departing from the scope of the appended claims. The transducers mentioned may have segmented membranes.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A sound system comprising:

for at least one information channel in at least a frequency range relevant for directivity, at least one pair of exactly two acoustic transducer structures (SA, SB), wherein a first acoustic transducer structure (SA) has a first axis (VA) extending in a maximum directional sensitivity of an uniaxial polar response pattern or being a rotational symmetry axis of a toroidal polar response pattern, a second acoustic transducer structure (SB) having a second axis (VB) extending in a maximum directional sensitivity of a uni-axial polar response pattern or being a rotational symmetry axis of a toroidal polar response pattern, wherein the first and second acoustic transducer structures (SA, SB) have a flat or convex membrane with respect to the wavelengths of transmission, means for directing the acoustic transducer structures (SA, SB) to obtain:

an angle of substantially −30 to 30 degrees between a median plane (C3) of a human reference listener (C2) and a line (Z) connecting acoustic centers (AC, BC) of the first acoustic transducer structure (SA) and the second acoustic transducer structure (SB), wherein both the first and the second acoustic transducer structures (SA, SB) are present at a same side of, or on, the median plane (C3), if both the first and the second transducer structures (SA, SB) have either a uni-axial or toroidal polar response pattern, an angle of substantially 70 to 110 degrees between the first axis (VA) and the second axis (VB), and an angle of substantially 70 to 110 degrees between said median plane (C3) and either the first or the second axis (VA, VB), and if the first acoustical transducer structure (SA) has a uni-axial polar response pattern and the second transducer stricture (SB) has a toroidal polar response pattern, an angle of 70 to 110 degrees between the first axis (VA) and a plane perpendicular to the second axis (VB), and an angle between 70 to 110 degrees between said median plane (C3) and either the first axis (VA) or the plane perpendicular to the second axis (VB), wherein a position (P) of the human reference listener (C2) is off-axis with respect to respective main axes and/or planes of maximum directional sensitivity of the first and second acoustic transducer structures (SA, SB), and means for processing (SBT; AMP) electrical signals received from or supplied to the transducer structures (SA, SB), wherein if the transducers structures are loudspeakers (L1, L2) the means for directing and the means for processing (AMP) are adapted to obtain substantially phase coherent sound waves at said position (P) for at least said information which is common for said loudspeakers (L1, L2).

2. A sound system as claimed in claim 1, wherein the first and second acoustic transducer structures (SA, SB) have, with respect to the relevant frequency range, monotonous diffuse field responses and have off axis flat free field responses along a line of latitude with respect to the main axes and/or planes of maximum directional sensitivity of the first and second acoustic transducer structures (SA, SB).

3. A sound system as claimed in claim 2, wherein the first and second acoustic transducer structures (SA, SB) have a rotational symmetric polar response pattern.

4. A sound system as claimed in claim 1, wherein the first and second acoustic transducer structures (SA, SB) have a rotational symmetric polar response pattern.

5. A sound system as claimed in claim 1, wherein the first and second acoustic transducer structures (SA, SB) have polar response patterns derived from baffle steps of the same order of magnitude.

6. A sound system as claimed in claim 5, wherein the baffle step is related to an air coupling surface having the dimensions in the order of a human head.

7. A sound system as claimed in claim 1, wherein the main axis or plane of the first acoustic transducer structure (SA) points substantially to an acoustical centre (BC) of the second transducer structure (SB).

8. A sound system as claimed in claim 1, wherein the first acoustic transducer structure (SA) comprises a plurality of transducers being concentrically arranged for covering together said frequency range.

9. A sound system as claimed in claim 1, comprising, for a monophonic channel, only the first transducer structure (SA) and the second acoustic transducer structure (SB).

10. A sound system as claimed in claim 1, wherein the means for positioning is adapted for positioning the first and second acoustic transducer structures (SA, SB) at a distance with respect to each other to obtain an angle in a range from 10 to 170 degrees between on the one hand a first imaginary line connecting an acoustical centre (AC) of the first acoustic transducer structure (SA) with the position (P) of the human reference listener and on the other hand a second imaginary line connecting an acoustical centre (SB) off the second acoustical transducer structure (SB) with said same position (P).

11. A sound system as claimed in claim 1, wherein if both the first and the second transducer structures (SA, SB) have either the uni-axial or toroidal polar response pattern, the angle between the first axis (VA) and the second axis (VB) of substantially 90 degrees, and the angle between said median plane (C3) and either the first or the second axis (VA, VB) is substantially 90 degrees, and if the first acoustical transducer (SA) has the uni-axial polar response pattern and the second transducer structure (SB) has the toroidal polar response pattern, the angle between the first axis (VA) and a plane perpendicular to the second axis (VB) is substantially 90 degrees, and the angle between said median plane (C3) and either the first axis (VA) or the plane perpendicular to the second axis (VB) is substantially 90 degrees.

12. A sound system as claimed in claim 1, wherein the first and second acoustic transducers structures (SA, SB) comprise transducers (L1, L2) are selected out of transducers being pistonic or bending wave converters having flat or convex membranes wherein the convex membranes are protruding out of said structures.

13. A sound system as claimed in claim 12, wherein the first and/or second acoustic transducers (L1, L2) have a plurality of concentric membranes for generating a plurality of sub-sound waves for different frequency bands, respectively.

14. A sound system as claimed in claim 1, wherein the first and the second acoustic transducer structures (SA, SB) each comprise at least one loudspeaker (L1, L2).

15. A sound system as claimed in claim 14, further comprising at least one amplifier (AMP) for supplying a same electrical signal to the first and the second acoustic transducers (L1, L2).

16. A sound system as claimed in claim 14, further comprising an amplifier (AMP) for supplying an amplified first signal (DA2) to the first loudspeaker (L1) and an amplified second signal (DB2) to the second loudspeaker (L2).

17. A sound system as claimed in claim 16, wherein the first and the second acoustic transducer structures (SA, SB) each comprise at least one loudspeaker (L1, L2), and wherein a configuration of the first and second loudspeaker (L1, L2) is reciprocal to a configuration of microphones.

18. A sound system as claimed in claim 1, wherein the first and the second acoustic transducer structures (SA, SB) each comprise at least one microphone, and wherein the sound system further comprises an audio recorder device (S1) and a storage medium (SBT) for storing a first signal (DA1) registered by the first microphone and a second signal (DB1) registered by the second microphone.

19. A multi-channel sound system comprising for at least two channels (S1, S2), each of the at least two channels (S1, S2) comprising:

at least one audio-information channel in at least a frequency range relevant for directivity, at least one pair of exactly two acoustic transducer structures (SA, SB), wherein a first acoustic transducer structure (SA) has a first axis (VA) extending in a maximum directional sensitivity of an uni-axial polar response pattern or being a rotational symmetry axis of a toroidal polar response pattern, a second acoustic transducer structure (SB) having a second axis (VB) extending in a maximum directional sensitivity of a uni-axial polar response pattern or being a rotational symmetry axis of a toroidal polar response pattern, wherein the first and second acoustic transducer structures (SA, SB) have a flat or convex membrane with respect to the wavelengths of transmission, means for directing the acoustic transducer structures (SA, SB) to obtain:

an angle of substantially −30 to 30 degrees between a median plane (C3) of a human reference listener (C2) and a line (Z) connecting acoustic centers (AC, BC) of the first acoustic transducer structure (SA) and the second acoustic transducer structure (SB), wherein both the first and the second acoustic transducer structures (SA, SB) are present at a same side of, or on, the median plane (C3), if both the first and the second transducer structures (SA, SB) have either a uni-axial or toroidal polar response pattern, an angle of substantially 70 to 110 degrees between the first axis (VA) and the second axis (VB), and an angle of substantially 70 to 110 degrees between said median plane (C3) and either the first or the second axis (VA, VB), and if the first acoustical transducer structure (SA) has a uni-axial polar response pattern and the second transducer stricture (SB) has a toroidal polar response pattern, an angle of 70 to 110 degrees between the first axis (VA) and a plane perpendicular to the second axis (VB), and an angle between 70 to 110 degrees between said median plane (C3) and either the first axis (VA) or the plane perpendicular to the second axis (VB), wherein a position (P) of the human reference listener (C2) is off-axis with respect to respective main axes and/or planes of maximum directional sensitivity of the first and second acoustic transducer structures (SA, SB), and means for processing (SBT; AMP) electrical signals received from or supplied to the transducer structures (SA, SB), wherein if the transducers structures are loudspeakers (L1, L2) the means for directing and the means for processing (AMP) are adapted to obtain substantially phase coherent sound waves at said position (P) for at least said information which is common for said loudspeakers (L1, L2).

20. A multi-channel sound system as claimed in claim 19, being a stereo system comprising a left channel and a right channel, each comprising a first sound system (S1) as claimed in claim 1, and a second sound system (S2) as claimed in claim 1, respectively, being laterally displaced and present at different sides of the median plane (C3).

21. A multi-channel sound system as claimed in claim 20, wherein either the corresponding first or second transducers structures (SA, SB) are identical and have substantially oppositely directed first or second axes (VA, VB).

22. A multi-channel sound system as claimed in claim 21 wherein the corresponding first or second transducers structures (SA, SB) with substantially oppositely directed first or second axis (VA, VB) are pointing to each others acoustical centers (AC, BC).

23. A multi-channel sound system as claimed in claim 19, wherein a signal for a sub-woofer channel is divided over the other loudspeakers (L1, L2).

24. A stand for a sound system, the sound system comprising:

at least one audio-information channel in at least a frequency range relevant for directivity, at least one pair of exactly two acoustic transducer structures (SA, SB), wherein a first acoustic transducer structure (SA) has a first axis (VA) extending in a maximum directional sensitivity of an uni-axial polar response pattern or being a rotational symmetry axis of a toroidal polar response pattern, a second acoustic transducer structure (SB) having a second axis (VB) extending in a maximum directional sensitivity of a uni-axial polar response pattern or being a rotational symmetry axis of a toroidal polar response pattern, wherein the first and second acoustic transducer structures (SA, SB) have a flat or convex membrane with respect to the wavelengths of transmission, means for directing the acoustic transducer structures (SA, SB) to obtain:

an angle of substantially −30 to 30 degrees between a median plane (C3) of a human reference listener (C2) and a line (Z) connecting acoustic centers (AC, BC) of the first acoustic transducer structure (SA) and the second acoustic transducer structure (SB), wherein both the first and the second acoustic transducer structures (SA, SB) are present at a same side of, or on, the median plane (C3), if both the first and the second transducer structures (SA, SB) have either a uni-axial or toroidal polar response pattern, an angle of substantially 70 to 110 degrees between the first axis (VA) and the second axis (VB), and an angle of substantially 70 to 110 degrees between said median plane (C3) and either the first or the second axis (VA, VB), and if the first acoustical transducer structure (SA) has a uni-axial polar response pattern and the second transducer stricture (SB) has a toroidal polar response pattern, an angle of 70 to 110 degrees between the first axis (VA) and a plane perpendicular to the second axis (VB), and an angle between 70 to 110 degrees between said median plane (C3) and either the first axis (VA) or the plane perpendicular to the second axis (VB), wherein a position (P) of the human reference listener (C2) is off-axis with respect to respective main axes and/or planes of maximum directional sensitivity of the first and second acoustic transducer structures (SA, SB), and means for processing (SBT; AMP) electrical signals received from or supplied to the transducer structures (SA, SB), wherein if the transducers structures are loudspeakers (L1, L2) the means for directing and the means for processing (AMP) are adapted to obtain substantially phase coherent sound waves at said position (P) for at least said information which is common for said loudspeakers (L1,L2), wherein the main axis or plane of the first acoustic transducer structure (SA) points substantially to an acoustical centre (BC) of the second transducer structure (SB), the stand, when in use, extending substantially in a vertical direction and having a first holder for holding the first transducer structure (SA) with its first axis (VA) extending substantially vertically and being directed towards a second holder for holding the second transducer structure (SB) with its second axis (VB) extending substantially horizontally.

25. A single encasing comprising two acoustic transducer structures (SA, SB), wherein a first acoustic transducer structure (SA) has a first axis (VA) extending in a maximum directional sensitivity of an uni-axial polar response pattern or being a rotational symmetry axis of a toroidal polar response pattern, a second acoustic transducer structure (SB) having a second axis (VB) extending in a maximum directional sensitivity of a uni-axial polar response pattern or being a rotational symmetry axis of a toroidal polar response pattern, wherein the first and second acoustic transducer structures (SA, SB) have a flat or convex membrane with respect to the wavelengths of transmission, means for directing the acoustic transducer structures (SA, SB) to obtain:

an angle of substantially −30 to 30 degrees between a median plane (C3) of a human reference listener (C2) and a line (Z) connecting acoustic centers (AC, BC) of the first acoustic transducer structure (SA) and the second acoustic transducer structure (SB), wherein both the first and the second acoustic transducer structures (SA, SB) are present at a same side of, or on, the median plane (C3), if both the first and the second transducer structures (SA, SB) have either a uni-axial or toroidal polar response pattern, an angle of substantially 70 to 110 degrees between the first axis (VA) and the second axis (VB), and an angle of substantially 70 to 110 degrees between said median plane (C3) and either the first or the second axis (VA, VB), and if the first acoustical transducer structure (SA) has a uni-axial polar response pattern and the second transducer structure (SB) has a toroidal polar response pattern, an angle of 70 to 110 degrees between the first axis (VA) and a plane perpendicular to the second axis (VB), and an angle between 70 to 110 degrees between said median plane (C3) and either the first axis (VA) or the plane perpendicular to the second axis (VB).

* * * * *